(12) United States Patent
Ikeda et al.

(10) Patent No.: US 10,636,479 B2
(45) Date of Patent: Apr. 28, 2020

(54) SEMICONDUCTOR MEMORY DEVICE

(71) Applicant: TOSHIBA MEMORY CORPORATION, Tokyo (JP)

(72) Inventors: Keiji Ikeda, Kawasaki Kanagawa (JP); Chika Tanaka, Fujisawa Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/114,178

(22) Filed: Aug. 27, 2018

(65) Prior Publication Data

US 2019/0295626 A1  Sep. 26, 2019

(30) Foreign Application Priority Data

Mar. 20, 2018 (JP) .................. 2018-052849

(51) Int. Cl.

| G11C 5/06 | (2006.01) |
|---|---|
| G11C 11/4096 | (2006.01) |
| H01L 27/108 | (2006.01) |
| G11C 11/4094 | (2006.01) |
| G11C 11/4074 | (2006.01) |
| G11C 11/56 | (2006.01) |
| G11C 11/4091 | (2006.01) |
| H01L 49/02 | (2006.01) |
| H01L 29/786 | (2006.01) |

(52) U.S. Cl.
CPC ...... *G11C 11/4096* (2013.01); *G11C 11/4074* (2013.01); *G11C 11/4091* (2013.01); *G11C 11/4094* (2013.01); *G11C 11/565* (2013.01); *H01L 27/10805* (2013.01); *H01L 27/10897* (2013.01); *H01L 28/60* (2013.01); *H01L 29/7869* (2013.01); *H01L 29/78642* (2013.01)

(58) Field of Classification Search
CPC ............ G11C 11/4096; G11C 11/4074; G11C 11/4091; G11C 11/565; H01L 27/10897; H01L 28/60
USPC .......................................................... 365/149
See application file for complete search history.

(56) References Cited

U.S. PATENT DOCUMENTS

| 5,303,183 A | 4/1994 | Asakura |
| 5,367,481 A | 11/1994 | Takase et al. |
| 5,495,440 A | 2/1996 | Asakura |

(Continued)

OTHER PUBLICATIONS

"Cell-plate line connecting complementary bit-line(C3) architecture for battery-Operating DRAMs" by M. Asakura et al., Symp. On VLSI Circuits., (1989) 101.

(Continued)

*Primary Examiner* — Viet Q Nguyen
(74) *Attorney, Agent, or Firm* — Kim & Stewart LLP

(57) ABSTRACT

A semiconductor memory device includes a first memory cell that includes a first transistor and a first capacitor, a second transistor having a first terminal that is connected to a first terminal of the first memory cell, a first bit line that is connected to a second terminal of the first memory cell, a second bit line that is connected to a second terminal of the second transistor, and a controller that turns on the first transistor and turns off the second transistor during a write operation on the first memory cell and turns on the first transistor and the second transistor during a read operation on the first memory cell.

14 Claims, 22 Drawing Sheets

(56) References Cited

U.S. PATENT DOCUMENTS

| | | | | |
|---|---|---|---|---|
| 5,526,302 A | * | 6/1996 | Takasugi | G11C 11/005 365/149 |
| 6,233,187 B1 | * | 5/2001 | Tsuchiya | G11C 7/12 365/201 |
| 6,337,824 B1 | * | 1/2002 | Kono | G11C 11/406 257/E27.097 |
| 6,480,422 B1 | * | 11/2002 | Wong | G11C 16/0416 257/E27.103 |
| 6,542,399 B2 | * | 4/2003 | Ricodeau | G11C 7/12 365/149 |
| 7,164,595 B1 | * | 1/2007 | Shore | G11C 11/4074 365/149 |
| 9,806,082 B2 | * | 10/2017 | Tanaka | G11C 5/025 |
| 9,978,441 B2 | * | 5/2018 | Tanaka | G11C 11/4045 |
| 2012/0106226 A1 | * | 5/2012 | Saito | G11C 11/404 365/51 |
| 2012/0275213 A1 | * | 11/2012 | Takemura | G11C 11/404 365/149 |
| 2018/0033478 A1 | | 2/2018 | Tanaka et al. | |
| 2018/0114578 A1 | * | 4/2018 | Ishizu | G11C 11/401 |

OTHER PUBLICATIONS

"Large-Signal 2T,1C DRAM Cell: Signal and Layout Analysis" by W.H. Henkels et al., IEEE J. of Soild-state circuits, 29 No.7 (1994) 829.

* cited by examiner

FIG. 20A COMPARATIVE EXAMPLE

FIG. 20B FIRST EMBODIMENT

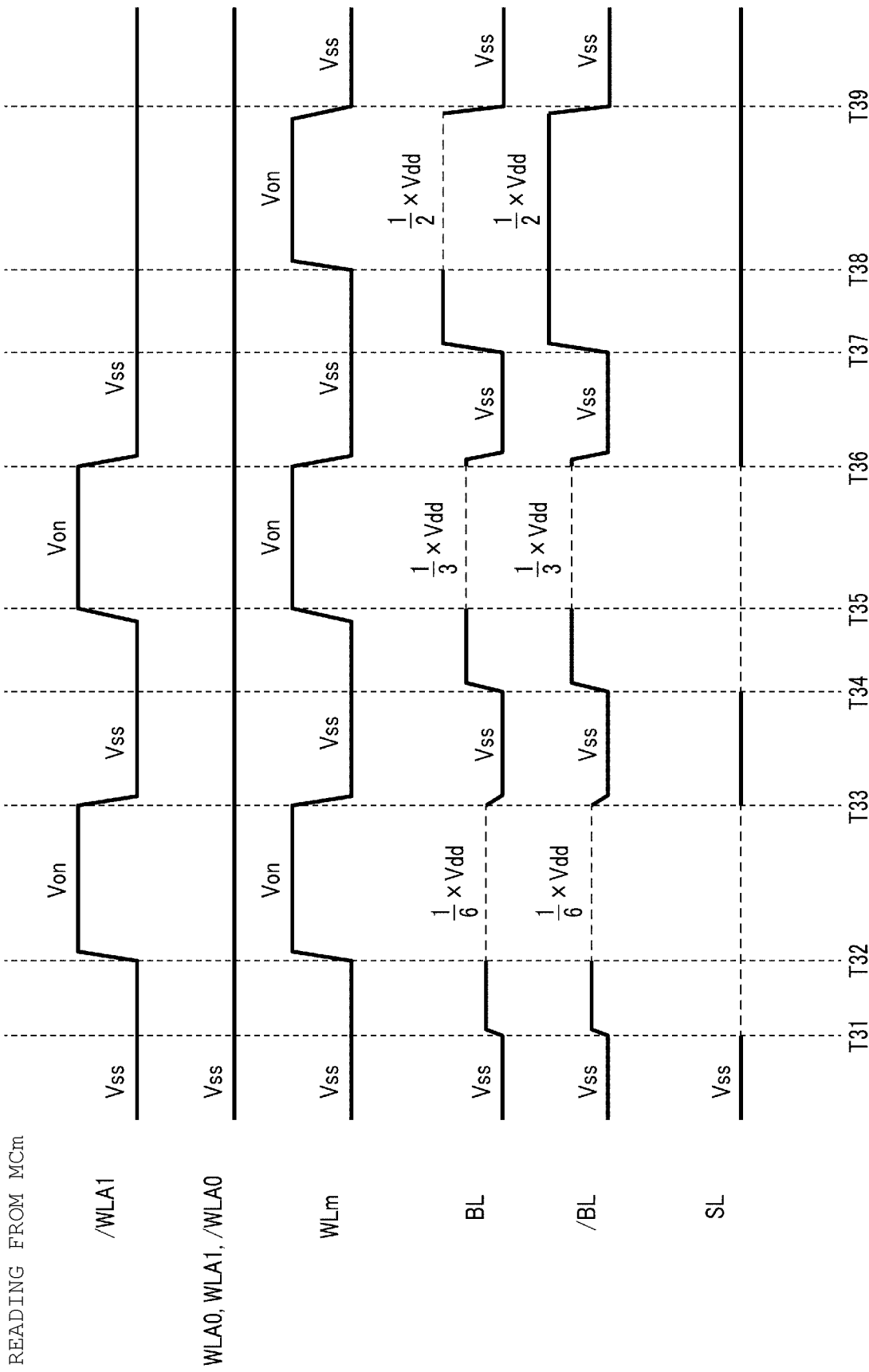

SEMICONDUCTOR MEMORY DEVICE

CROSS-REFERENCE TO RELATED APPLICATIONS

This application is based upon and claims the benefit of priority from Japanese Patent Application No. 2018-052849, filed Mar. 20, 2018, the entire contents of which are incorporated herein by reference.

FIELD

Embodiments described herein relate generally to a semiconductor memory device.

BACKGROUND

A dynamic random access memory (DRAM) is used in various applications such as a main memory, a buffer memory, and the like of a computer system.

DESCRIPTION OF THE DRAWINGS

FIG. 22 is a timing chart of various voltages during a read operation of a memory cell in the semiconductor memory device according to the second embodiment.

DETAILED DESCRIPTION

Figure 1:
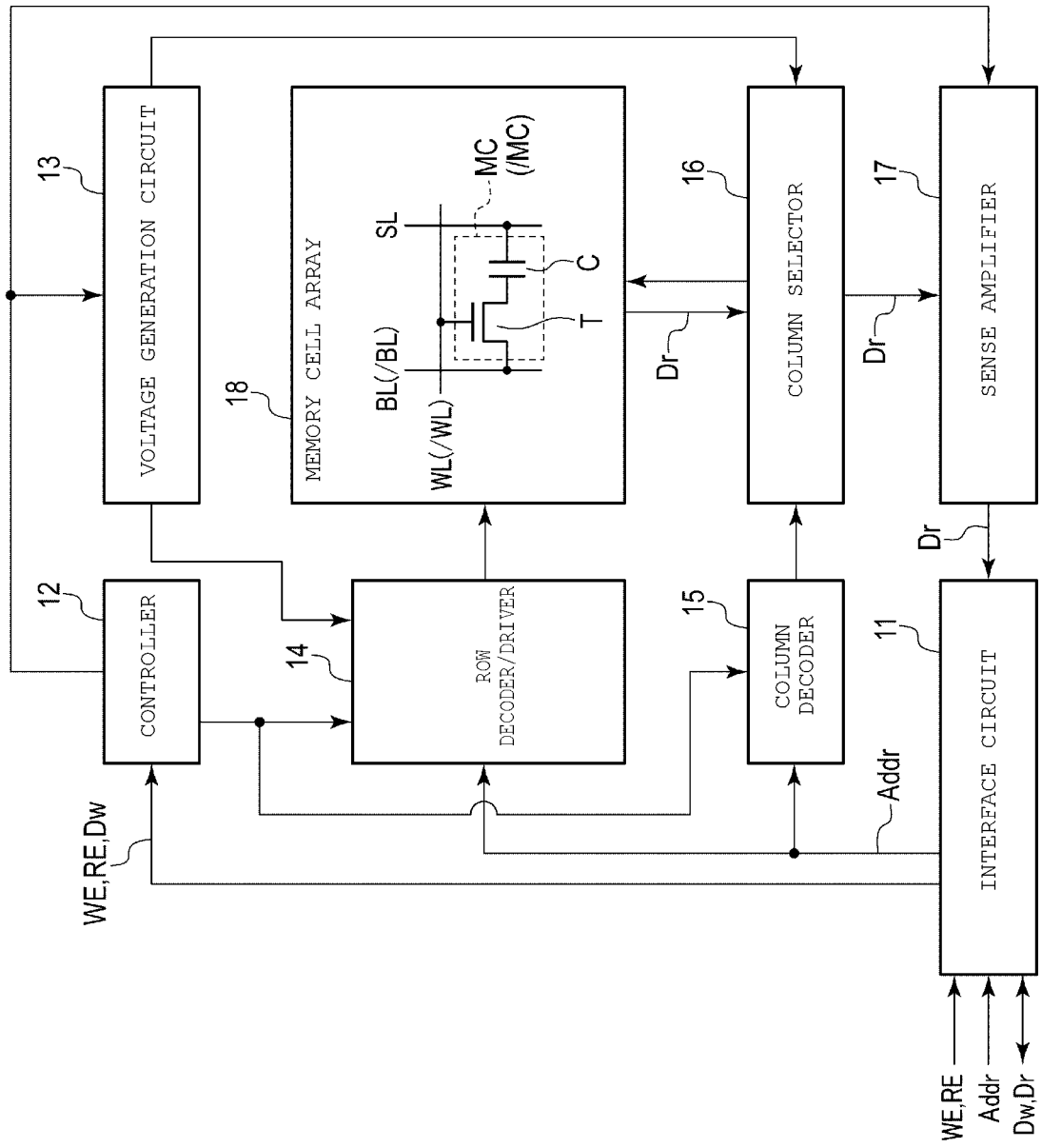
FIG. 1 is a diagram illustrating an overall configuration example of a semiconductor memory device according to a first embodiment.

Embodiments provide a semiconductor memory device that reduces an occurrence of a read error.

In general, according to one embodiment, a semiconductor memory device includes a first memory cell that includes a first transistor and a first capacitor, a second transistor having a first terminal that is connected to a first terminal of the first memory cell, a first bit line that is connected to a second terminal of the first memory cell, a second bit line that is connected to a second terminal of the second transistor, and a controller that turns on the first transistor and turns off the second transistor during a write operation on the first memory cell and turns on the first transistor and the second transistor during a read operation on the first memory cell.

The present embodiments will be described below with reference to the drawings. In the drawings, the same reference numerals or symbols are given to the same elements.

First Embodiment

A semiconductor memory device according to a first embodiment will be described below with reference to FIGS. 1 to 20B. Hereinafter, a case where the semiconductor memory device is a three-dimensionally stacked DRAM will be described.

In the following description, the term "connection" includes not only a case of a direct connection but also a case of a connection via a certain element. In addition, a first terminal of a transistor indicates any one of a source and a drain, and a second terminal of the transistor indicates the other of the source and the drain. In addition, a control terminal of the transistor is a gate thereof.

Configuration Example According to First Embodiment

FIG. 1 is a diagram illustrating an overall configuration example of a semiconductor memory device (DRAM) according to the first embodiment.

As illustrated in FIG. 1, the semiconductor memory device includes an interface circuit 11, a controller 12, a voltage generation circuit 13, a row decoder/driver 14, a column decoder 15, a column selector 16, a sense amplifier 17, and a memory cell array 18.

The interface circuit 11 receives a write enable signal WE, a read enable signal RE, an address signal Addr, and write data Dw from the outside. In addition, the interface circuit transmits read data Dr to the outside.

The controller 12 controls operations of the voltage generation circuit 13, the row decoder/driver 14, the column decoder 15, and the sense amplifier 17, based on the write enable signal WE, the read enable signal RE, and the write data Dw from the interface circuit 11.

For example, if receiving the write enable signal WE, the controller 12 enables the voltage generation circuit 13, the row decoder/driver 14, and the column decoder 15 to enter an operating state and enables the sense amplifier 17 to enter a non-operating state. In addition, the controller 12 instructs the voltage generation circuit 13 to generate a voltage necessary for the write operation.

In addition, for example, if receiving the read enable signal RE, the controller 12 enables the voltage generation circuit 13, the row decoder/driver 14, the column decoder 15, and the sense amplifier 17 to enter an operating state. In addition, the controller 12 instructs the voltage generation circuit 13 to generate a plurality of voltages necessary for the read operation.

The row decoder/driver 14 selects a word line WL, based on the address signal Addr from the interface circuit 11. Then, the row decoder/driver 14 supplies a voltage from the voltage generation circuit 13 to the selected word line WL.

The column decoder 15 selects a bit line BL and a source line SL by using the column selector 16, based on the address signal Addr from the interface circuit 11. The voltage from the voltage generation circuit 13 is supplied to the selected bit line BL and the selected source line SL via the column selector 16.

The sense amplifier 17 senses a voltage of the selected bit line BL and detects data stored in a memory cell MC. The read data Dr from the memory cell MC is transmitted to the outside via the column selector 16, the sense amplifier 17, and the interface circuit 11.

The memory cell array 18 includes a plurality of bit lines BL and /BL, a plurality of source lines SL, a plurality of word lines WL and /WL, and a plurality of memory cells MC and /MC. The plurality of bit lines BL and /BL and the plurality of source lines extend in the X direction which will be described below. The plurality of word lines WL and /WL extend in the Y direction which will be described below. The memory cell MC is provided at an intersection position between the bit line BL, the source line SL, and the word line WL. The memory cell /MC is provided at an intersection position between the bit line /BL, the source line SL, and the word line /WL.

Figure 2:
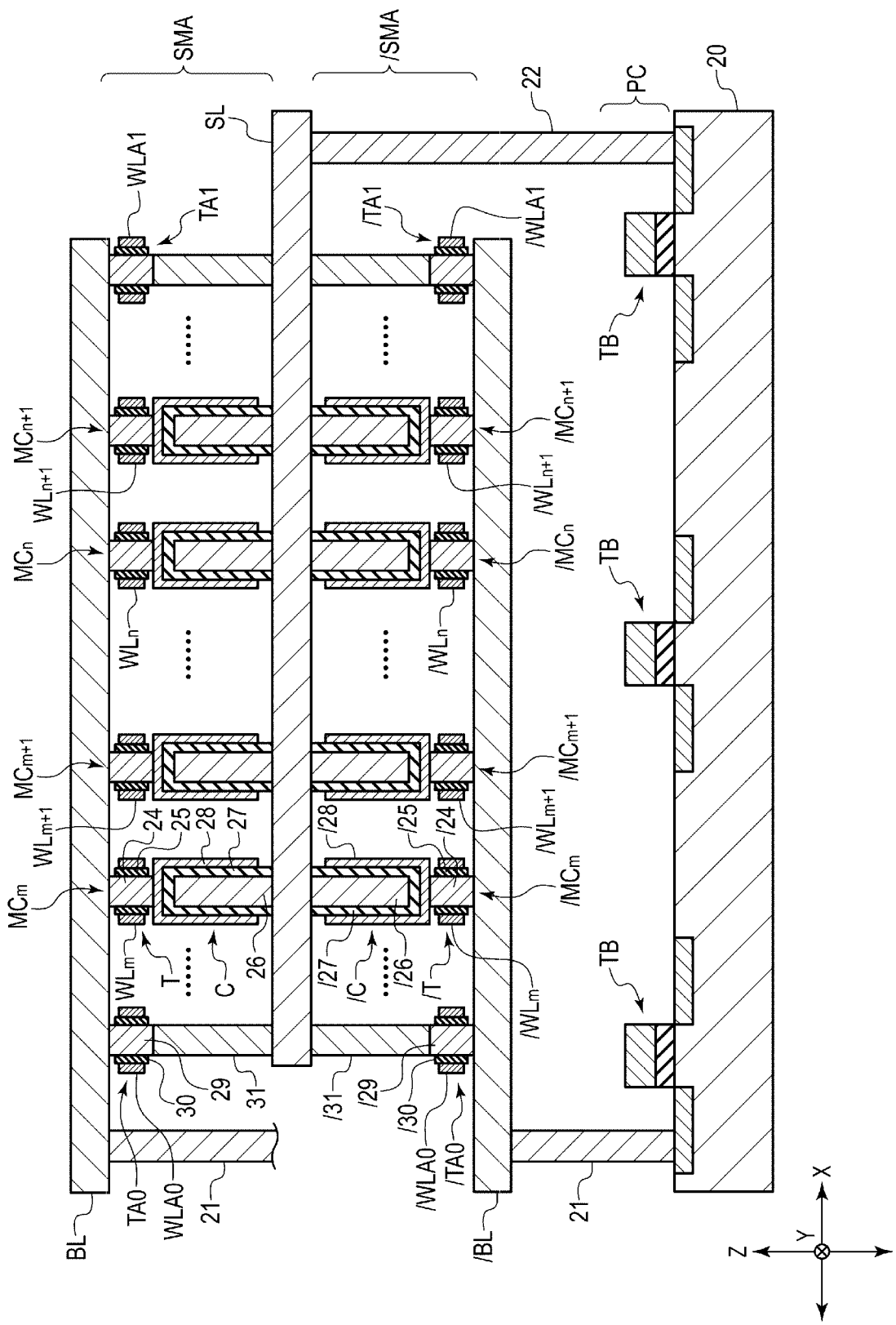
FIG. 2 is a sectional view illustrating a memory cell array of the semiconductor memory device according to the first embodiment.
Figure 3:
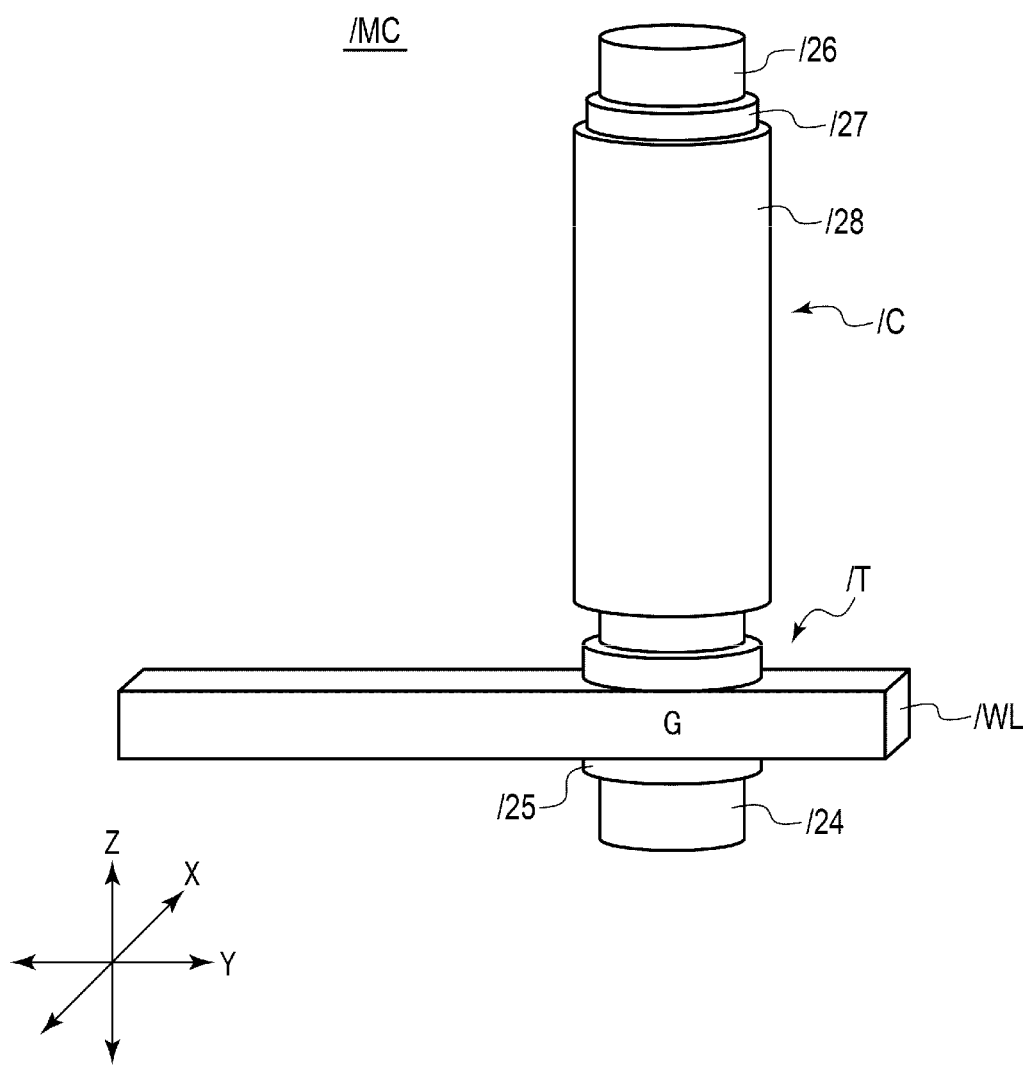
FIG. 3 is a perspective view illustrating a detailed memory cell of FIG. 2.
Figure 4:
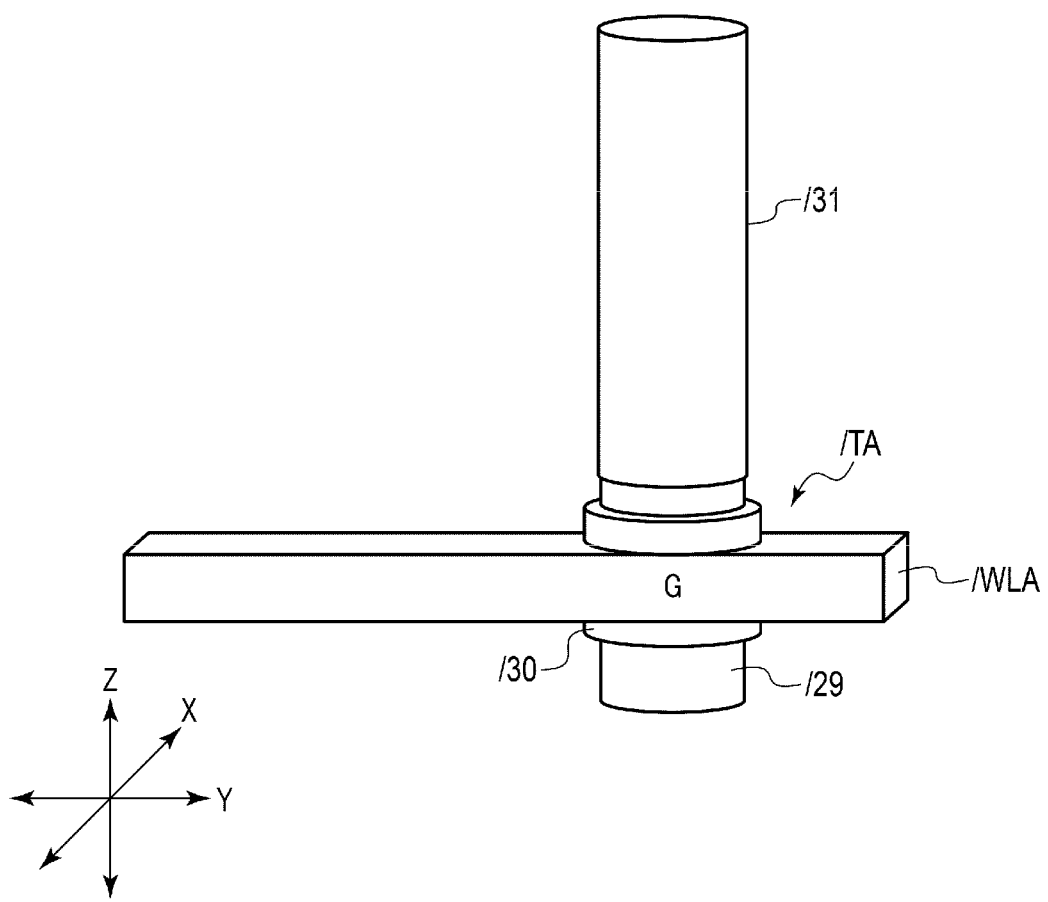
FIG. 4 is a perspective view illustrating a detailed transistor of FIG. 2.
Figure 5:
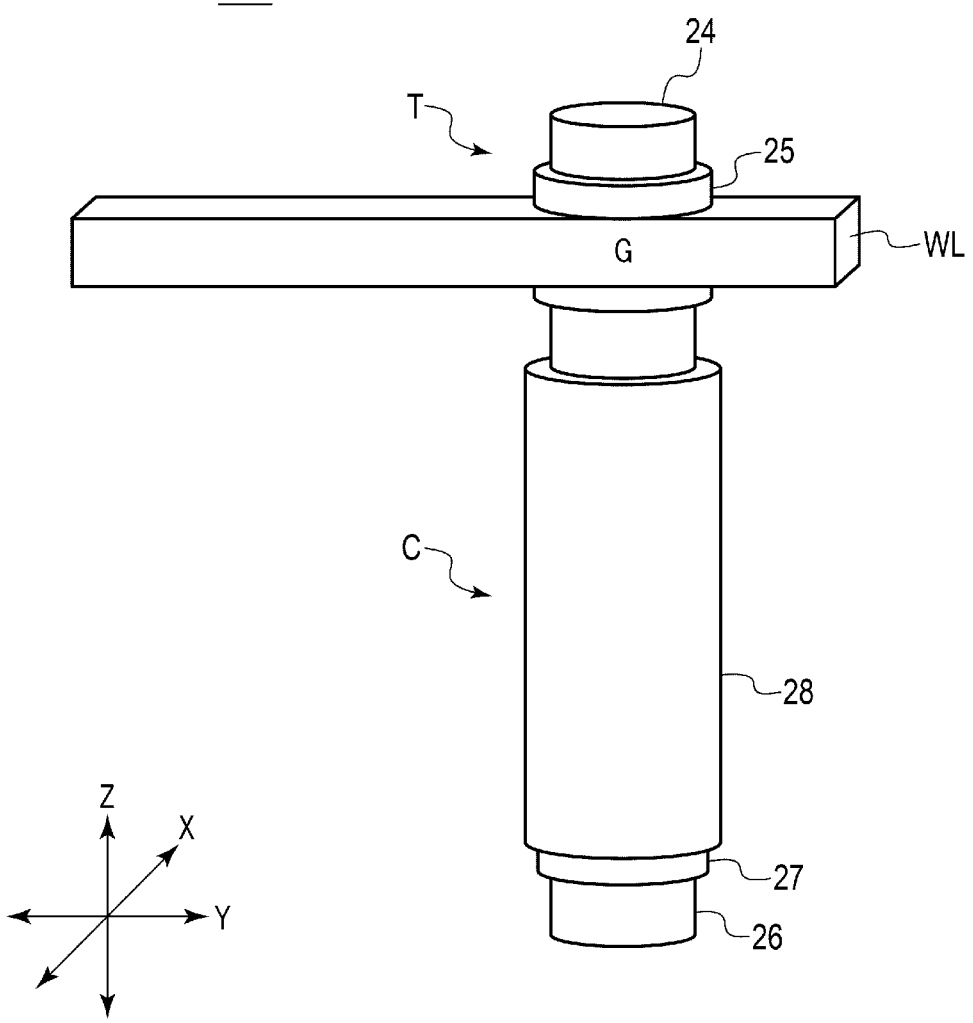
FIG. 5 is a perspective view illustrating the detailed memory cell of FIG. 2.
Figure 6:
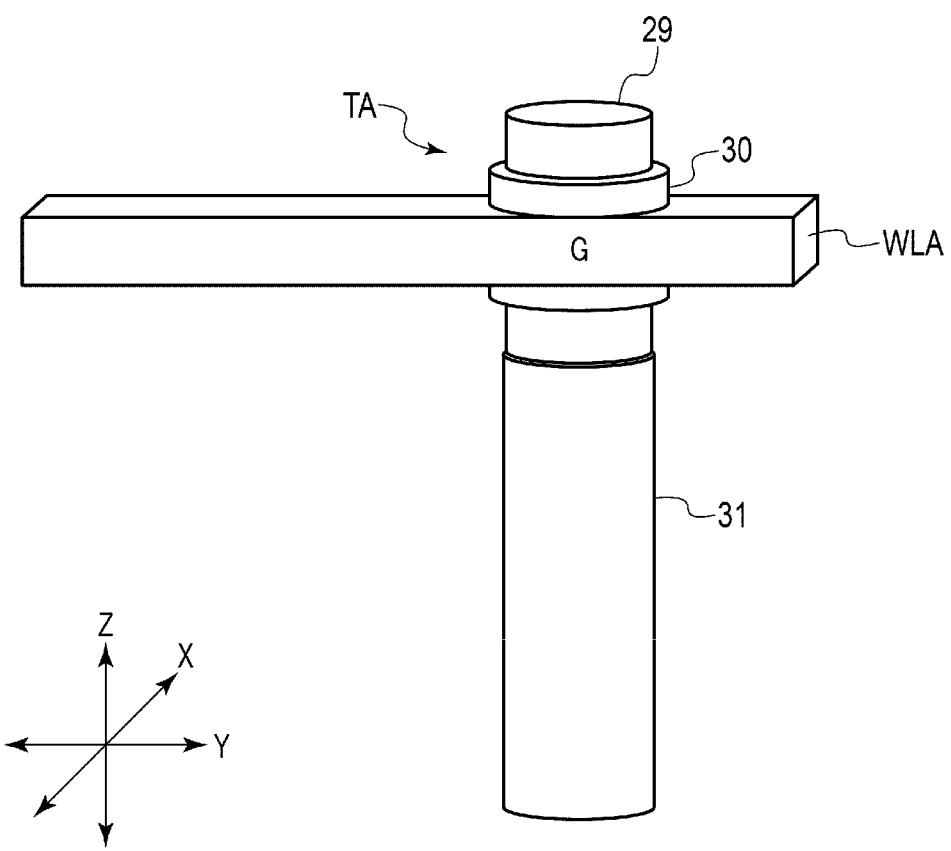
FIG. 6 is a perspective view illustrating the detailed transistor of FIG. 2.

FIG. 2 is a sectional view illustrating the memory cell array 18 of the semiconductor memory device according to the first embodiment. FIG. 3 is a perspective view illustrating a detailed memory cell /MC of FIG. 2, and FIG. 4 is a perspective view illustrating a detailed transistor /TA of FIG. 2. FIG. 5 is a perspective view illustrating a detailed memory cell MC of FIG. 2, and FIG. 6 is a perspective view illustrating a detailed transistor TA of FIG. 2.

Hereinafter, in the present specification, an XYZ orthogonal coordinate system is adopted for the sake of convenient description. It is assumed that two directions parallel to a main surface of a semiconductor substrate 20 and orthogonal to each other are referred to as the "X direction" and the "Y direction", and a direction perpendicular to the main surface of the semiconductor substrate 20 is referred to as the "Z direction (also the stack direction)". In the Z direction, a direction from the semiconductor substrate 20 toward the memory cells MC and /MC is referred to as "up" and a direction from the memory cells MC and /MC toward the semiconductor substrate 20 is referred to as "down", but these notations are for the sake of convenience, and it is not necessarily related to a direction of gravity.

As illustrated in FIG. 2, the memory cell array 18 includes a peripheral circuit PC and sub memory cell arrays SMA and /SMA on the semiconductor substrate 20.

The semiconductor substrate 20 is a silicon substrate. The peripheral circuit PC is provided on the semiconductor substrate 20. The peripheral circuit PC includes a plurality of transistors TB provided on the semiconductor substrate 20. The transistor TB includes a gate insulation layer, a gate electrode, and a source drain diffusion layer which are provided on the semiconductor substrate 20. The peripheral circuit PC supplies each control line of the memory cell array 18 with a voltage or the like to control each operation.

The bit line /BL, the source line SL, and the bit line BL are sequentially provided over the peripheral circuit PC. All the bit lines BL and /BL and the source line SL extend in the X direction. The bit lines BL and /BL are electrically connected to the peripheral circuit PC via a contact 21, and the source line SL is electrically connected to the peripheral circuit PC via a contact 22.

The sub memory cell array /SMA is provided between the bit line /BL and the source line SL. The sub memory cell array /SMA includes a plurality of memory cells /MC ( . . . , /MCm, /MCm+1, . . . , /MCn, /MCn+1, . . . ) and two transistors /TA (/TA0 and /TA1). The plurality of memory cells /MC are aligned in the X direction. The two transistors /TA are provided at opposite ends in the X direction, respectively. That is, the plurality of memory cells /MC are provided between the two transistors /TA0 and /TA1 in the X direction.

Each of the plurality of memory cells /MC includes a select transistor /T and a capacitor /C sequentially provided on the bit line /BL. The select transistor /T of each of the plurality of memory cells /MC ( . . . , /MCm, /MCm+1, . . . , /MCn, /MCn+1, . . . ) includes a semiconductor layer /24, a gate insulation layer /25, and the word lines /WL ( . . . , /WLm, /WLm+1, . . . , /WLn, /WLn+1, . . . ). The capacitor /C includes a pillar electrode /26, an insulation layer /27, and a cell electrode /28.

As illustrated in FIG. 3, the semiconductor layer /24 extends inside the word line /WL in the Z direction. A lower surface of the semiconductor layer /24 is connected to the bit line /BL. The gate insulation layer /25 is provided between the semiconductor layer /24 and the word line /WL. The word line /WL extends in the Y direction. The pillar electrode /26 extends in the Z direction. An upper surface of the pillar electrode /26 is connected to the source line SL. The insulation layer /27 covers a side surface and a lower surface of the pillar electrode /26. The cell electrode /28 covers a side surface and a lower surface of the insulation layer /27. A lower surface of the cell electrode /28 is connected to an upper surface of the semiconductor layer /24.

Each of the select transistors /T is, for example, a vertical type transistor in which a semiconductor layer /24 serving as a channel intersects an upper surface of the bit line /BL. The semiconductor layer /24 may be formed of any material as long as the semiconductor layer is separated from the semiconductor substrate 20. For example, the semiconductor layer /24 may be an epitaxial single crystal silicon layer, a polysilicon layer, an amorphous silicon layer, or the like. In addition, the semiconductor layer /24 may be an oxide semiconductor layer.

Recently, a so-called oxide semiconductor thin film transistor (TFT) having excellent off-leak characteristics (characteristics of a small leakage current at off time) has been proposed. The oxide semiconductor TFT is characterized by using an oxide semiconductor as a channel. The oxide semiconductor contains, for example, indium oxide, gallium oxide, and zinc oxide, and is referred to as InGaZnO (IGZO). The oxide semiconductor may also be, for example, tin oxide, aluminum oxide, silicon oxide, or the like. The oxide semiconductor TFT may be adopted as the select transistor /T.

The oxide semiconductor TFT may be formed, for example, in a process of a low temperature of approximately 200° C. Accordingly, a thermal stress is not applied to the peripheral circuit PC on the semiconductor substrate 20 in the wafer process, and thus, the oxide semiconductor TFT is a very effective technique for manufacturing DRAMs with a three-dimensional structure. In addition, the oxide semiconductor TFT can significantly reduce a leakage current at OFF time as compared with a general silicon channel transistor.

Thus, if an oxide semiconductor (for example, IGZO or the like) is used as the semiconductor layer /24, the DRAM having a very long data holding time (retention time) may be achieved.

For example, in a case of the select transistor /T having silicon as a channel, the retention time is approximately 64 msec. Accordingly, data has to be refreshed (rewritten) in a short cycle. In contrast to this, in a case of the select transistor /T using IGZO as a channel, the retention time is approximately 10 days. Accordingly, refreshing of data is not needed as often and this improves system performance.

In the present embodiment, the semiconductor layer /24 which is a channel of the select transistor /T has a columnar shape, and is not limited thereto. The gate insulation layer /25 includes, for example, an insulator such as silicon oxide. The word line /WL includes a metal material such as aluminum, copper, tungsten, molybdenum, cobalt, or the like, or an alloy thereof.

The capacitor /C is a so-called pillar type capacitor. The capacitor /C has a columnar shape and is not limited thereto. The pillar electrode /26 and the cell electrode /28 contain a metal material such as titanium, tantalum, aluminum, copper, tungsten, or the like. The insulation layer /27 contains, for example, tungsten oxide, silicon oxide, aluminum oxide, hafnium oxide, zirconium oxide, tantalum oxide, a stacked structure thereof, or the like.

Referring back to FIG. 2, each of the transistors /TA (/TA0 and /TA1) includes the semiconductor layer /29, a gate insulation layer /30, and word lines /WLA (/WLA0 and /WLA1).

As illustrated in FIG. 4, the semiconductor layer /29 extends inside the word line /WLA in the Z direction. A lower surface of the semiconductor layer /29 is connected to the bit line /BL. An upper surface of the semiconductor layer /29 is connected to the source line SL via a contact /31 (which is a metal layer). The gate insulation layer /30 is provided between the semiconductor layer /24 and the word line /WL. The word line /WLA extends in the Y direction.

The transistor /TA has the same structure and includes the same material as, for example, the select transistor /T. In addition, the contact /31 contains a metal material such as titanium, tantalum, aluminum, copper, tungsten, or the like.

Referring back to FIG. 2, the sub memory cell array SMA is provided between the bit line /BL and the source line SL. That is, the sub memory cell array SMA is provided over the sub memory cell array /SMA. The sub memory cell array SMA includes a plurality of memory cells MC ( . . . , MCm, MCm+1, . . . , MCn, MCn+1, . . . ) and two transistors TA (TA0 and TA1). The plurality of memory cells MC are aligned in the X direction. Each of the two transistors TA is provided at one end on one side and the other end of the one side in the X direction. That is, the plurality of memory cells MC are provided between the two transistors TA0 and TA1 in the X direction.

Each of the plurality of memory cells MC includes a capacitor C and a select transistor T which are sequentially provided on the source line SL. The select transistor T of each of the plurality of memory cells MC ( . . . , MCm, MCm+1, . . . , MCn, MCn+1, . . . ) includes a semiconductor layer 24, a gate insulation layer 25 and the word lines WL ( . . . , WLm, WLm+1, . . . , WLn, WLn+1, . . . ). The capacitor C includes a pillar electrode 26, an insulation layer 27, and a cell electrode 28.

As illustrated in FIG. 5, the semiconductor layer 24 extends inside the word line WL in the Z direction. An upper surface of the semiconductor layer 24 is connected to the bit line BL. The gate insulation layer 25 is provided between the semiconductor layer 24 and the word line WL. The word line WL extends in the Y direction. The pillar electrode 26 extends in the Z direction. A lower surface of the pillar electrode 26 is connected to the source line SL. The insulation layer 27 covers a side surface and an upper surface of the pillar electrode 26. The cell electrode 28 covers a side surface and an upper surface of the insulation layer 27. An upper surface of the cell electrode 28 is connected to a lower surface of the semiconductor layer 24.

In this way, the memory cell MC in the sub memory cell array SMA has a configuration opposite to the configuration of the memory cell /MC in the sub memory cell array /SMA. The memory cell MC shares the source line SL with the memory cell /MC. Each layer of the memory cell MC contains the same material as each layer of the memory cell /MC.

Referring back to FIG. 2, each of the transistors TA (TA0 and TA1) includes the semiconductor layer 29, a gate insulation layer 30, and the word lines WLA (WLA0 and WLA1).

As illustrated in FIG. 6, the semiconductor layer 29 extends inside the word line WLA in the Z direction. The upper surface of the semiconductor layer 29 is connected to the bit line BL. A lower surface of the semiconductor layer 29 is connected to the source line SL via a contact 31 (which is a metal layer). The gate insulation layer 30 is provided between the semiconductor layer 24 and the word line WL. The word line WLA extends in the Y direction.

In this manner, the transistor TA and the contact 31 in the sub memory cell array SMA have a structure that is upside down with respect to the transistor /TA and the contact /31 in the sub memory cell array /SMA. Each layer of the transistor TA and the contact 31 contains the same material as each layer of the transistor /TA and the contact /31.

While not illustrated in FIG. 2, the sub memory arrays /SMA and SMA may be sequentially provided over the bit line BL in the same manner as above. That is, the source line SL (hereinafter, referred to as a second source line SL) and the bit line /BL (hereinafter, referred to as a second bit line /BL) are sequentially provided over the bit line BL. The sub memory array /SMA is provided between the bit line BL and the second source line SL, and the sub memory array SMA is provided between the second source line SL and the second bit line /BL.

In addition, as described above, the sub memory arrays /SMA and SMA are provided in the Y direction of FIG. 2 in common with the word lines WL, /WL, WLA, and /WLA.

Figure 7:
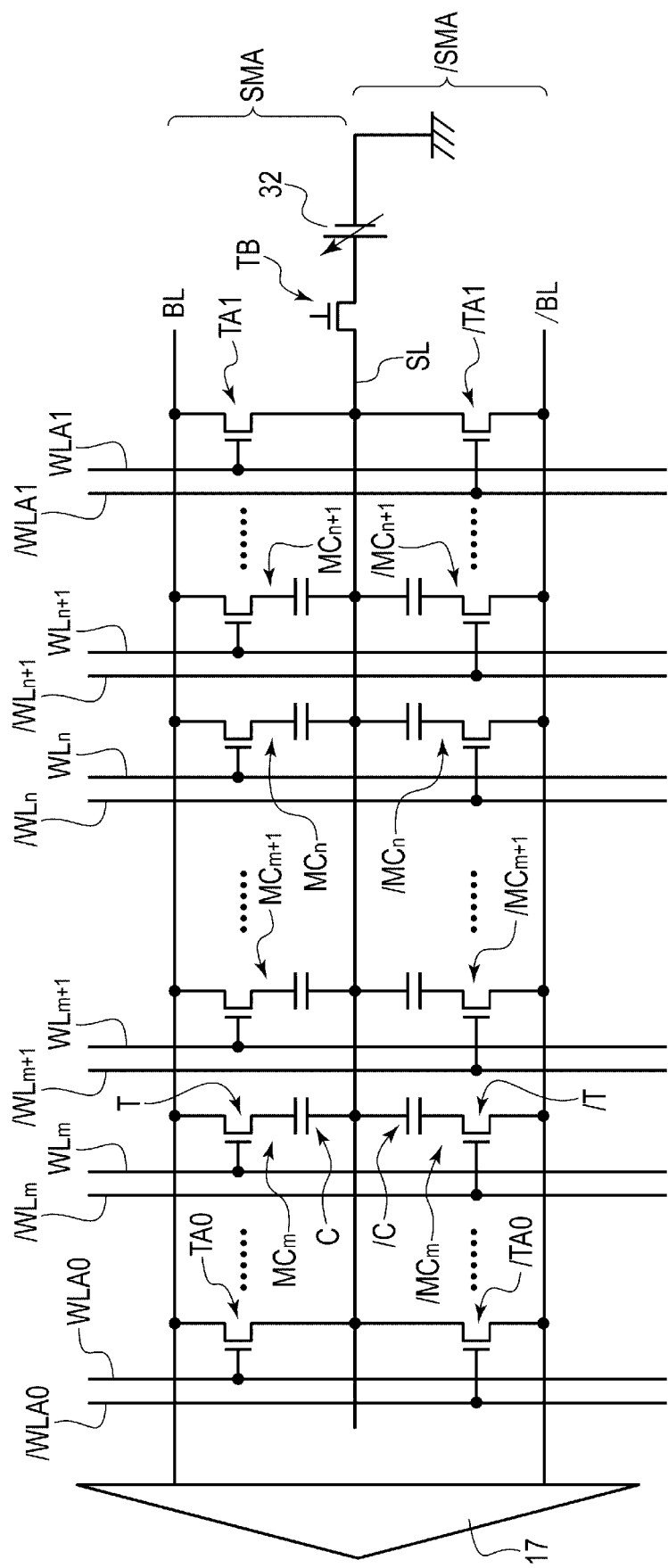
FIG. 7 is a circuit diagram illustrating the memory cell array of the semiconductor memory device according to the first embodiment.

FIG. 7 is a circuit diagram illustrating the memory cell array 18 of the semiconductor memory device according to the first embodiment, and is a circuit diagram corresponding to the memory cell array 18 illustrated in FIG. 2.

As illustrated in FIG. 7, the memory cell array 18 includes the bit lines BL and /BL, the source line SL, the plurality of word lines WL, the plurality of word lines /WL, the two word lines WLA, the two word lines /WLA, and the sub memory cell arrays SMA and /SMA.

The bit line BL, the source line SL, and the bit line /BL are alternately aligned with the plurality of word lines WL and the plurality of word lines /WL. The word lines WLA0 and /WLA0 and the word lines WLA1 and WLA1 are provided at opposite ends, respectively, such that the plurality of word lines WL and the plurality of word lines /WL are interposed therebetween.

The sub memory cell array SMA is provided between the bit line BL and the source line SL. The sub memory cell array SMA includes the plurality of memory cells MC (..., MCm, MCm+1, ..., MCn, MCn+1, ...) and two transistors TA (TA0 and TA1).

Each of the plurality of memory cells MC (..., MCm, MCm+1, ..., MCn, MCn+1, ...) is provided at an intersection position between the bit line BL and the source line SL, and the plurality of word lines WL (..., WLm, WLm+1, ..., WLn, WLn+1, ...). Each of the plurality of memory cells MC includes the select transistor T and the capacitor C.

More specifically, a first terminal of the select transistor T of the memory cell MCm is electrically connected to the bit line BL, and a second terminal of the select transistor T of the memory cell MCm is electrically connected to a first electrode of the capacitor C of the memory cell MCm. A second electrode of the capacitor C of the memory cell MCm is electrically connected to the source line SL. A control terminal of the select transistor T of the memory cell MCm is electrically connected to the word line WLm.

In the same manner, a first terminal of the select transistor T of each of the memory cells MCm+1, MCn, and MCn+1 is electrically connected to the bit line BL, and a second terminal of the select transistor T of each of the memory cells MCm+1, ..., MCn, and MCn+1 is electrically connected to a first electrode of the capacitor C of each of the memory cells MCm+1, ..., MCn, and MCn+1. A second electrode of the capacitor C of each of the memory cells MCm+1, ..., MCn, and MCn+1 is electrically connected to the source line SL. A control terminal of the select transistor T of each of the memory cells MCm+1, ..., MCn, and MCn+1 is electrically connected to the word lines WLm, WLm+1, ..., WLn, and WLn+1.

The transistor TA0 is provided at an intersection position between the bit line BL and the source line SL, and the word line WLA0. The transistor TA1 is provided at an intersection position between the bit line BL and the source line SL, and the word line WLA1. That is, the two transistors TA0 and TA1 sandwich the plurality of memory cells MC therebetween.

A first terminal of the transistor TA0 is electrically connected to the bit line BL, and a second terminal of the transistor TA0 is electrically connected to the source line SL. A control terminal of the transistor TA0 is electrically connected to the word line WLA0. Meanwhile, a first terminal of the transistor TA1 is electrically connected to the bit line BL, and a second terminal of the transistor TA1 is electrically connected to the source line SL. A control terminal of the transistor TA1 is electrically connected to the word line WLA1.

The sub memory cell array /SMA is provided between the bit line /BL and the source line SL. The sub memory cell array /SMA includes a plurality of memory cells /MC (..., /MCm, /MCm+1, ..., /MCn, /MCn+1, ...) and two transistors /TA (/TA0 and /TA1).

Each of the plurality of memory cells /MC (, /MCm, /MCm+1, ..., /MCn, /MCn+1, ...) is provided at an intersection position between the bit line /BL and the source line SL, and the plurality of word lines /WL (..., /WLm, /WLm+1, ..., /WLn, /WLn+1, ...). Each of the plurality of memory cells /MC includes the select transistor /T and the capacitor /C.

More specifically, a first terminal of the select transistor /T of the memory cell /MCm is electrically connected to the bit line /BL, a second terminal of the select transistor /T of the memory cell /MCm is electrically connected to a first electrode of the capacitor /C. A second electrode of the capacitor /C of the memory cell /MCm is electrically connected to the source line SL. A control terminal of the select transistor /T of the memory cell /MCm is electrically connected to the word line /WLm.

In the same manner, a first terminal of the select transistors /T of each of the memory cells /MCm+1, ..., /MCn, and /MCn+1 is electrically connected to the bit line /BL, and a second terminal of the select transistor /T of each of the memory cells /MCm+1, ..., MCn, and /MCn+1 is electrically connected to a first electrode of the capacitor /C of each of the memory cells /MCm+1, ..., /MCn, and /MCn+1. A second electrode of the capacitor /C of each of the memory cells /MCm+1, ..., /MCn, and /MCn+1 is electrically connected to the source line SL. A control terminal of the select transistor /T of each of the memory cells /MCm+1, /MCn, and /MCn+1 is electrically connected to each of the word lines /WLm, /WLm+1, ..., /WLn, and /WLn+1.

The transistor /TA0 is provided at an intersection position between the bit line /BL and source line SL, and the word line /WLA0. The transistor /TA1 is provided at an intersection position between the bit line /BL and the source line SL, and the word line /WLA1. That is, the two transistors /TA0 and /TA1 sandwich the plurality of memory cells /MC therebetween.

A first terminal of the transistor /TA0 is electrically connected to the bit line /BL, and a second terminal of the transistor /TA0 is electrically connected to the source line SL. A control terminal of the transistor /TA0 is electrically connected to the word line /WLA0. Meanwhile, a first terminal of the transistor /TA1 is electrically connected to the bit line /BL, and a second terminal of the transistor /TA1 is electrically connected to the source line SL. A control terminal of the transistor /TA1 is electrically connected to the word line /WLA1.

A distance from the memory cells MCm and MCm+1 to the transistor /TA1 is farther than a distance from the memory cells MCm and MCm+1 to the transistor /TA0. A distance from the memory cells MCn and MCn+1 to the transistor /TA0 is farther than a distance from the memory cells MCn and MCn+1 to the transistor /TA1.

In the same manner, a distance from the memory cells /MCm and /MCm+1 to the transistor TA1 is farther than a distance from the memory cells /MCm and /MCm+1 to the transistor TA0. In addition, a distance from the memory cells /MCn and /MCn+1 to the transistor TA0 is farther than a distance from the memory cells /MCn and /MCn+1 to the transistor TA1.

The bit line BL and the bit line /BL are electrically connected to the sense amplifier 17. The sense amplifier 17 senses a voltage difference (which corresponds to a read signal) between the bit line BL and the bit line /BL at the time of reading and detects data corresponding to the voltage difference.

The source line SL is electrically connected to a variable power supply 32 via the transistor TB. That is, a first terminal of the transistor TB is electrically connected to the source line SL, and a second terminal of the transistor TB is electrically connected to a positive electrode of the variable power supply 32. A negative electrode of the variable power supply 32 is electrically connected to a ground voltage line. As a result, a certain voltage may be supplied to the source line SL.

Operation Example According to First Embodiment

Figure 8:
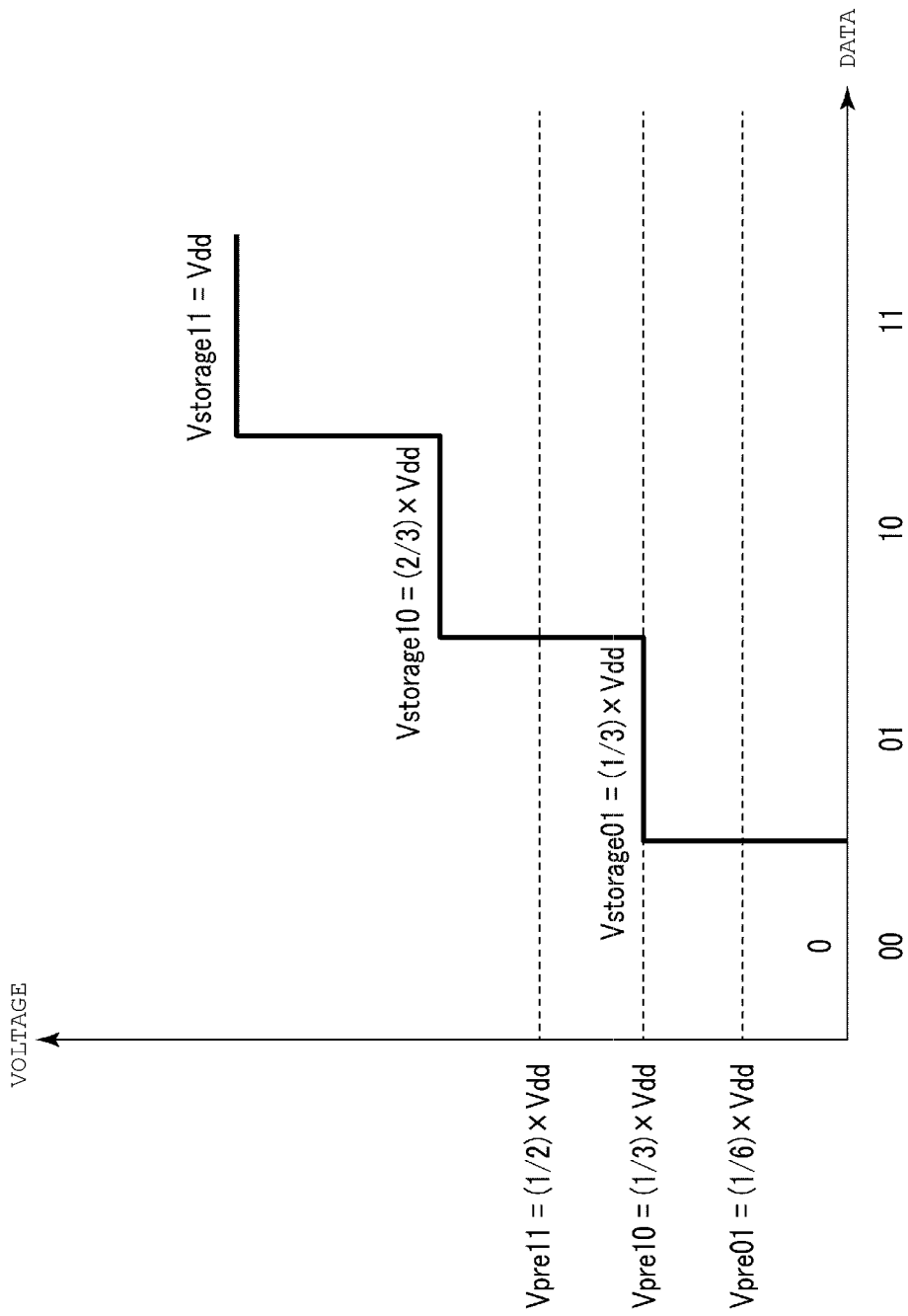
FIG. 8 is a diagram illustrating a relationship between data stored in the memory cell of the semiconductor memory device according to the first embodiment and a voltage.

FIG. 8 is a diagram illustrating a relationship between data and a voltage stored in the memory cells MC and /MC (capacitors C and /C) of the semiconductor memory device according to the first embodiment. Here, an example in which the memory cells MC and /MC store 2-bit data (00, 01, 10, 11) is illustrated.

First, a write operation of the memory cells MC and /MC will be described.

As illustrated in FIG. 8, data (electric charges to be held) stored in the capacitors C and /C is controlled by a write voltage Vstorage. The write voltage Vstorage is a difference between a voltage applied to the first electrode of the capacitors C and /C at the time of writing and a voltage applied to the second electrode at the time of writing. That is, the write voltage Vstorage is controlled by a difference between a voltage applied to the bit lines BL and /BL and a voltage applied to the source line SL.

For example, in a case where data 11 is written to the capacitor C, a voltage Vdd (for example, power supply voltage) is set as a write voltage Vstorage11. At this time, the voltage Vdd is applied to the bit line BL and 0 V is applied to the source line SL. In addition, in a case where data 10 is written to the capacitor C, a voltage ($\frac{2}{3}$)×Vdd is set as a write voltage Vstorage10. At this time, the voltage Vdd is applied to the bit line BL, and a voltage ($\frac{1}{3}$)×Vdd is applied to the source line SL. In addition, in a case where data 01 is written to capacitor C, the voltage ($\frac{1}{3}$)×Vdd is set as a write voltage Vstorage01. At this time, the voltage Vdd is applied to bit line BL and the voltage ($\frac{2}{3}$)×Vdd is applied to source line SL. In a case where data 00 is written to the capacitor C, 0 V is set as a write voltage Vstorage00. At this time, the voltage Vdd is applied to the bit line BL, and the voltage Vdd is applied to the source line SL.

In a case where the data 00, 01, 10, and 11 are written to the capacitor /C, the same voltages as the voltages of the bit line BL described above are respectively applied to the bit line /BL.

In this manner, the write voltage Vstorage is controlled by constantly applying the power supply voltage Vdd to the bit line BL and adjusting a voltage of the source line SL. That is, by constantly maintaining the bit line BL at a high voltage, a fast write operation may be achieved.

Next, a read operation of the memory cells MC and /MC will be described.

Data stored in the capacitors C and /C is read by applying a read voltage (which corresponds to a precharge voltage) Vpre to the bit lines BL and /BL and turning on the select transistors T and /T. The read voltage Vpre is a certain voltage (referred to herein as open voltage) when the sense amplifier 17 is connected to the bit lines BL and /BL. After the read voltage Vpre is applied, the sense amplifier 17 senses a voltage change based on the held data and reads the multivalue data at once.

The read operation is not limited to the above example. For example, as will be described below in the second embodiment, a plurality of read voltages Vpre01, Vpre10, and Vpre11 may be time-divisionally applied to the bit lines BL and /BL and data read. At this time, as illustrated in FIG. 8, the plurality of read voltages Vpre01, Vpre10, and Vpre11 are half of the write voltages Vstorage01, Vstorage10, and Vstorage11, respectively. That is, the read voltage Vpre01 is a voltage ($\frac{1}{6}$)×Vdd, Vpre10 is a voltage ($\frac{1}{3}$)×Vdd, and Vpre11 is a voltage ($\frac{1}{2}$)×Vdd.

In addition, in a case where time-dimensional reading is performed, a plurality of sense amplifiers 17 connected in a time division manner are provided. This configuration will be described in a second embodiment.

The write operation and the read operation will be described in more detail below.

In the present example, a write operation is performed on a memory cell configured with one transistor and one capacitor, while a read operation is performed on a memory cell configured with two pseudo transistors and one capacitor. Details will be described below.

Figure 9:
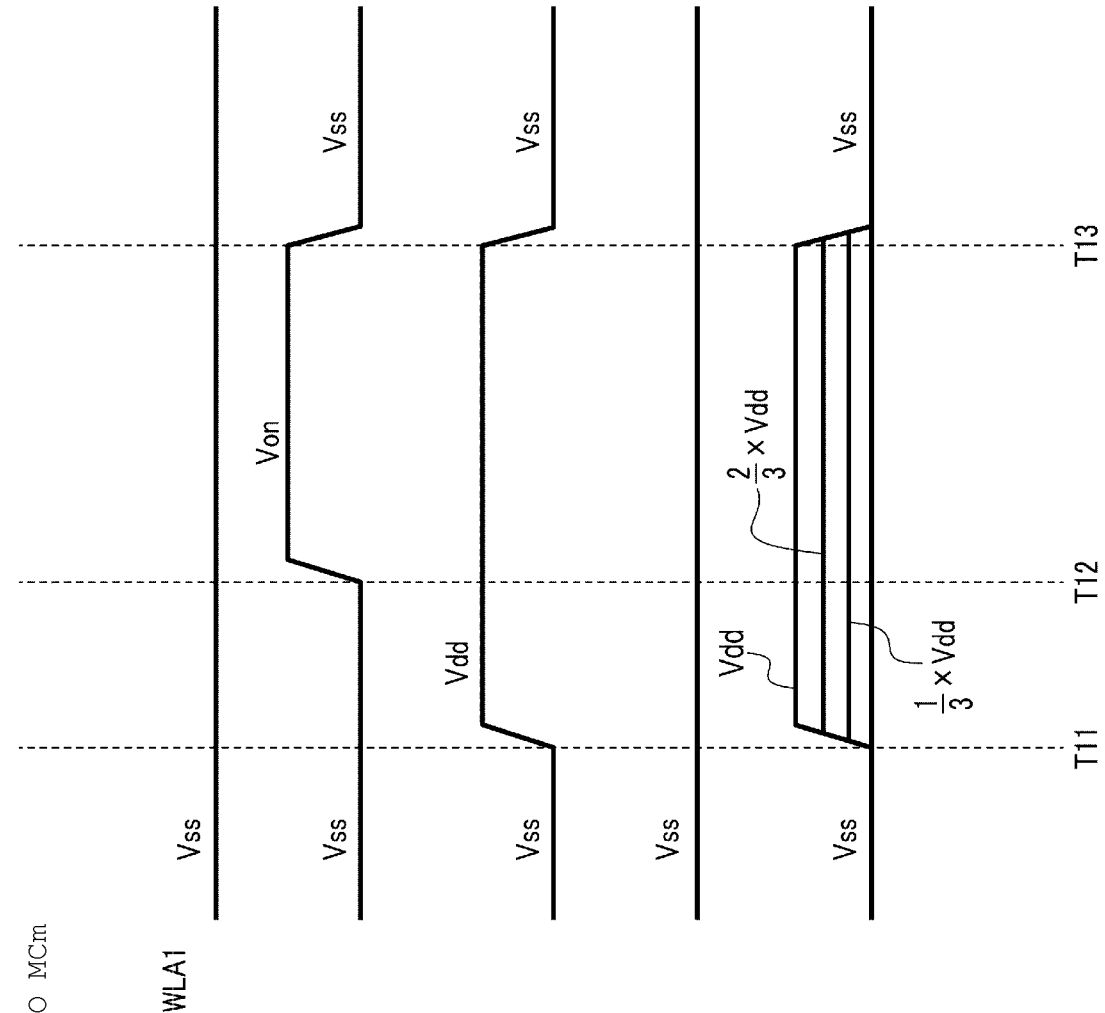
FIG. 9 is a timing chart of various voltages during a write operation of the memory cell in the semiconductor memory device according to the first embodiment.
Figure 10:
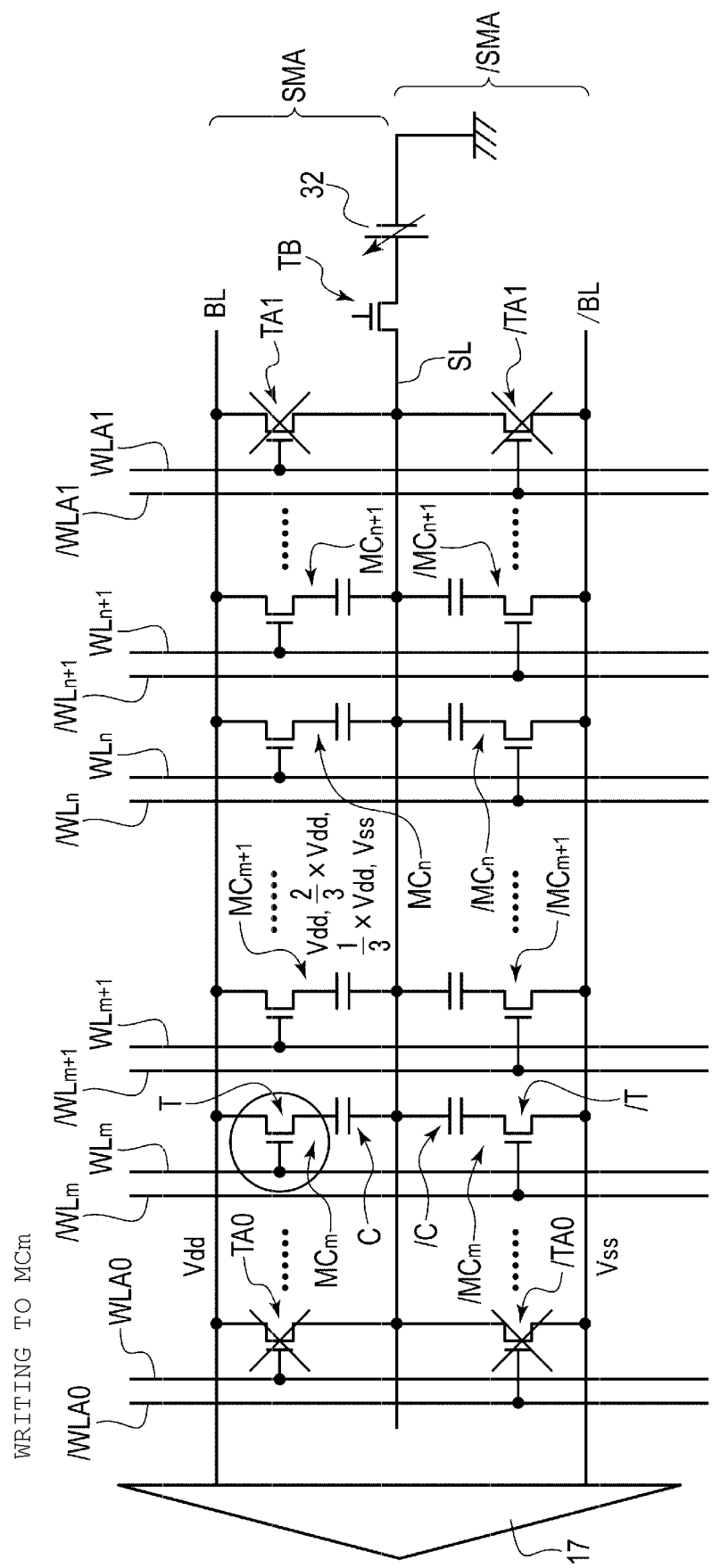
FIG. 10 is a diagram illustrating the write operation of the memory cell in the semiconductor memory device according to the first embodiment.

FIG. 9 is a timing chart of various voltages during the write operation of the memory cell MCm in the semiconductor memory device according to the first embodiment. FIG. 10 is a diagram illustrating the write operation of the memory cell MCm in the semiconductor memory device according to the first embodiment and corresponds to times T12 to T13 in FIG. 9.

As illustrated in FIG. 9, in the write operation of the memory cell MCm, a voltage Vss (for example, a ground voltage (0 V)) is applied to each control line as initial setting.

Next, at time T11, the voltage Vdd is applied to the bit line BL. Meanwhile, the bit line /BL maintains the voltage Vss. In addition, at the time T11, a voltage corresponding to data to be written is applied to the source line SL. As described above, the voltage Vss is applied to the source line SL in a case where data 11 is written, the voltage ($\frac{1}{3}$)×Vdd is applied to the source line SL in a case where data 10 is written, the voltage ($\frac{2}{3}$)×Vdd is applied to the source line SL in a case where data 01 is written, and the voltage Vdd is applied to the source line SL in a case where data 00 is written.

Next, at time T12, a voltage Von is applied to the word line WLm. The voltage Von is a voltage at which the select transistor T is sufficiently turned on. Here, turning on the transistor indicates that the select transistor T transfers a certain voltage from a first terminal thereof to a second terminal thereof. Meanwhile, the other word lines WL and /WL maintain the voltage Vss. In addition, the word lines WLA (WLA0 and WLA1) and the word lines /WLA (/WLA0 and /WLA1) maintain the voltage Vss.

Thereby, as illustrated in FIG. 10, the select transistor T of the memory cell MCm is turned on, and the select transistors T of the other memory cells MC and the select transistors /T of the memory cells /MC are turned off. In addition, the transistors TA0, TA1, /TA0, and /TA1 are turned off. As a result, a voltage difference occurs between the first electrode and the second electrode of the capacitor C of the memory cell MCm, and data 11, 10, and 01 corresponding to the voltage difference are written. In a case where no voltage difference occurs (in a case where the voltage Vdd is applied to the bit line BL and the source line SL), the data 00 is written.

Thereafter, as illustrated in FIG. 9, the voltage Vss is applied to each control line at time T13. By doing so, writing data to the memory cell MCm is completed.

Figure 11:
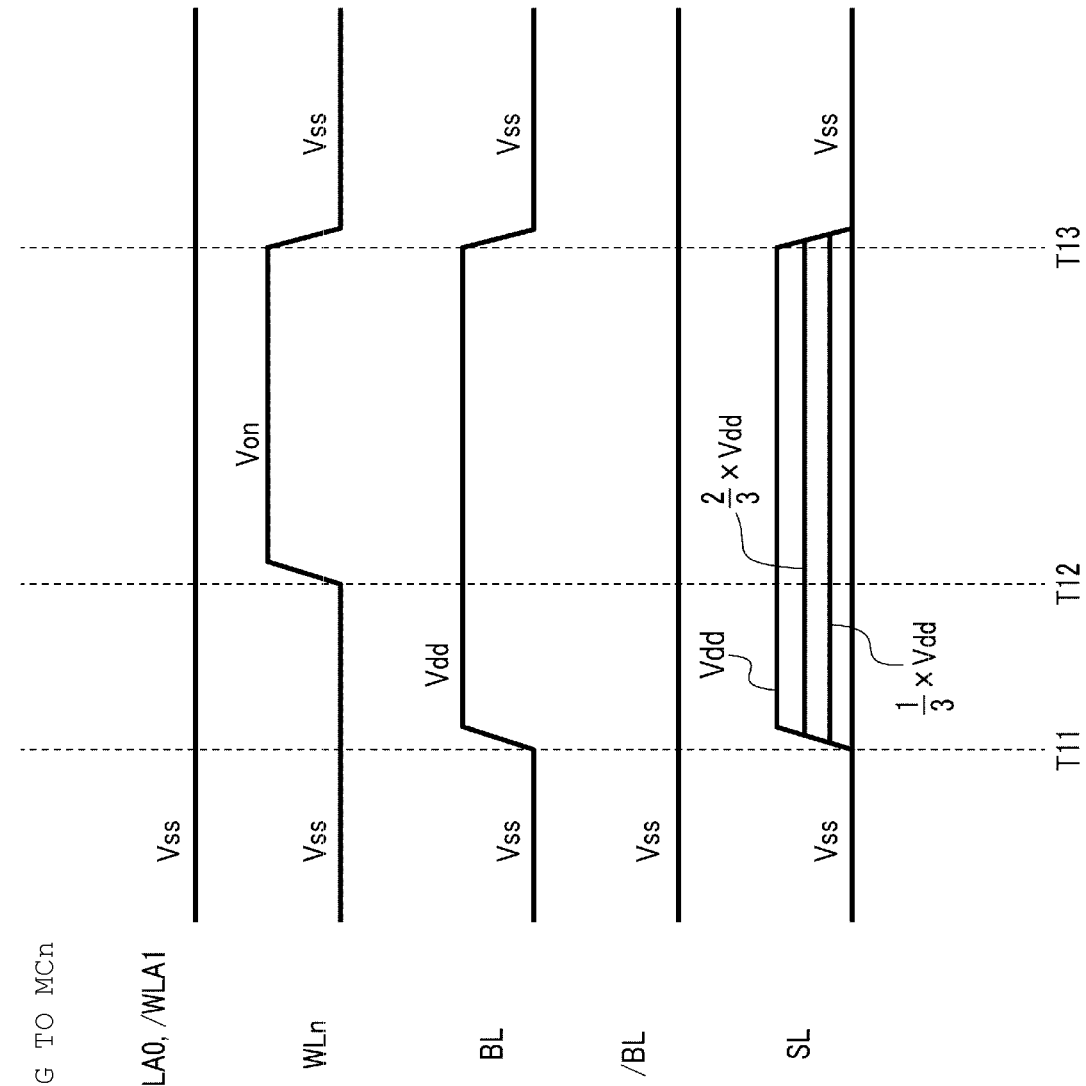
FIG. 11 is a timing chart of various voltages during the write operation of the memory cell in the semiconductor memory device according to the first embodiment.

FIG. 11 is a timing chart of various voltages during the write operation of the memory cell MCn in the semiconductor memory device according to the first embodiment.

As illustrated in FIG. 11, in the write operation of the memory cell MCn, the voltage Von is applied to the word line WLn at time T12 unlike the write operation of the memory cell MCm of FIG. 9.

Thereby, the select transistor T of the memory cell MCn is turned on, and the select transistors T of the other memory cells MC and the select transistors /T of the memory cells /MC are turned off. As a result, a voltage difference occurs between the first electrode and the second electrode of the capacitor C of the memory cell MCn, and the data 11, 10, and 01 corresponding to the voltage difference is written. In a case where no voltage difference occurs (in a case where the voltage Vdd is applied to the bit line BL and the source line SL), the data 00 is written.

Figure 12:
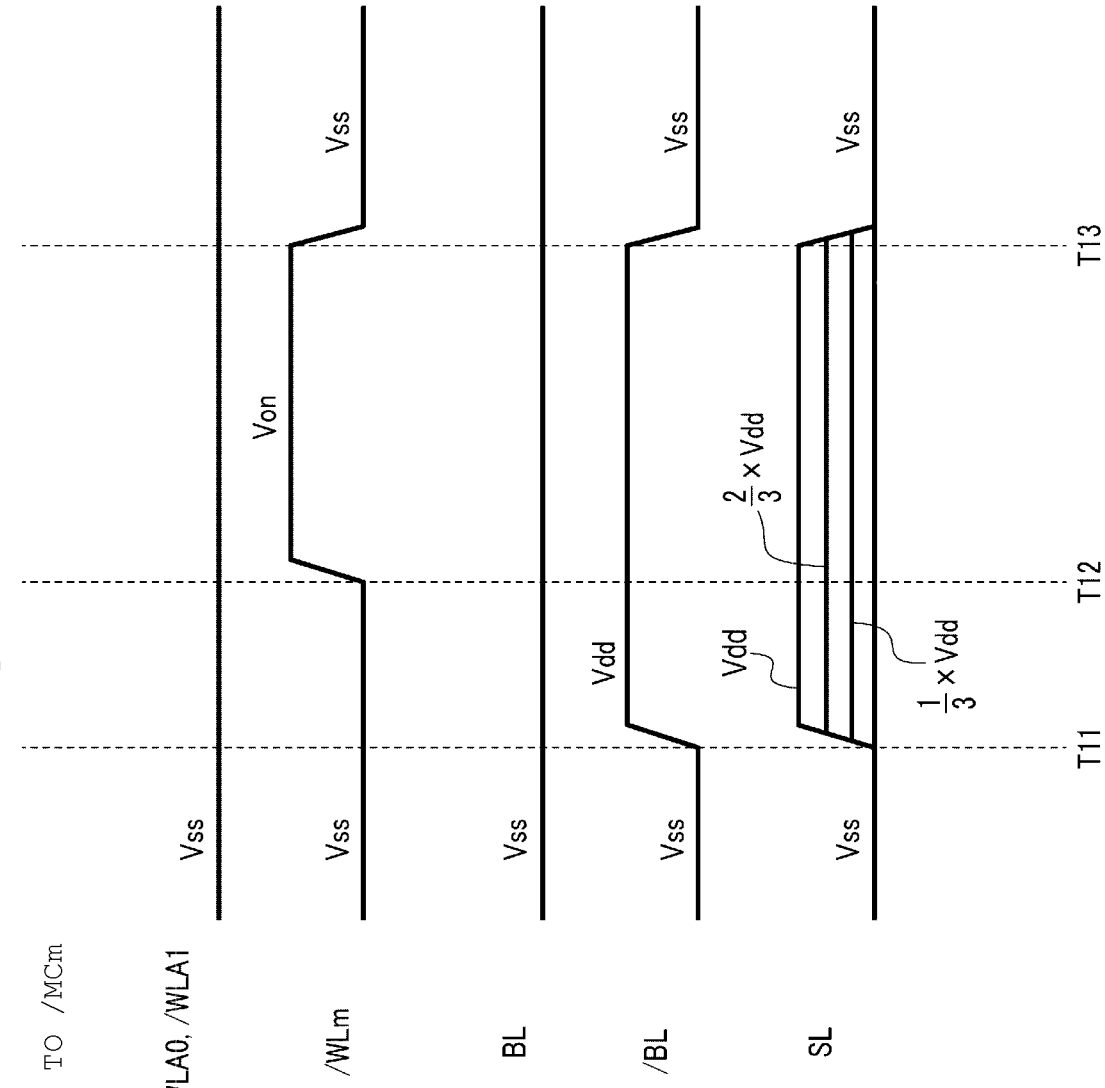
FIG. 12 is a timing chart of various voltages during the write operation of the memory cell in the semiconductor memory device according to the first embodiment.

FIG. 12 is a timing chart of various voltages during the write operation of the memory cell /MCm in the semiconductor memory device according to the first embodiment.

As illustrated in FIG. 12, in the write operation of the memory cell /MCm, the voltage Vdd is applied to the bit line /BL at time T11 unlike the write operation of the memory cell MCm of FIG. 9. Furthermore, at time T12, the voltage Von is applied to the word line /WLm.

Thereby, the select transistor /T of the memory cell /MCm is turned on, and the select transistors /T of the other memory cells /MC and the select transistors T of the memory cells MC are turned off. As a result, a voltage difference occurs between the first electrode and the second electrode of the capacitor C of the memory cell /MCm, and the data 11, 10, and 01 corresponding to the voltage difference is written. In a case where no voltage difference occurs (in a case where the voltage Vdd is applied to the bit line /BL and the source line SL), the data 00 is written.

Figure 13:
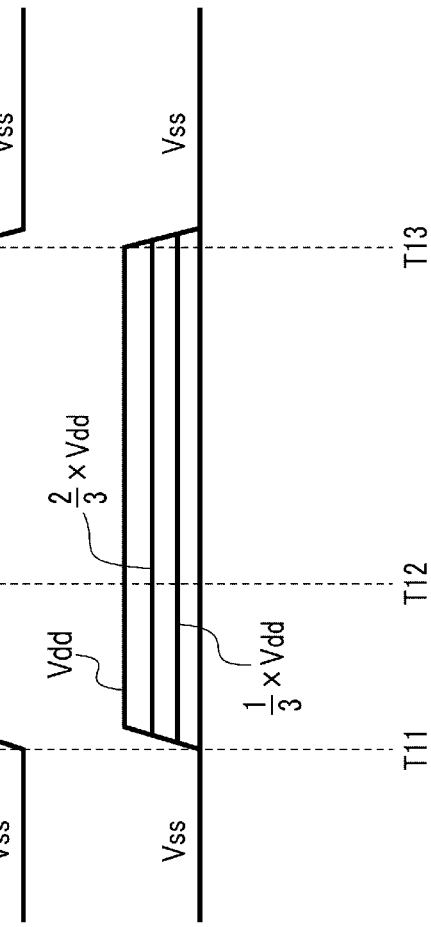
FIG. 13 is a timing chart of various voltages during the write operation of the memory cell in the semiconductor memory device according to the first embodiment.

FIG. 13 is a timing chart of various voltages during the write operation of the memory cell /MCn in the semiconductor memory device according to the first embodiment.

As illustrated in FIG. 13, in the write operation of memory cell /MCn, the voltage Vdd is applied to bit line /BL at time T11, unlike the write operation of memory cell MCm of FIG. 9. Furthermore, at time T12, the voltage Von is applied to the word line /WLn.

Thereby, the select transistor /T of the memory cell /MCn is turned on, and the select transistors /T of the other memory cells /MC and the select transistors T of the memory cells MC are turned off. As a result, a voltage difference occurs between the first electrode and the second electrode of the capacitor C of the memory cell /MCn, and the data 11, 10, and 01 corresponding to the voltage difference is written. In a case where no voltage difference occurs (in a case where the voltage Vdd is applied to the bit line /BL and the source line SL), the data 00 is written.

Figure 14:
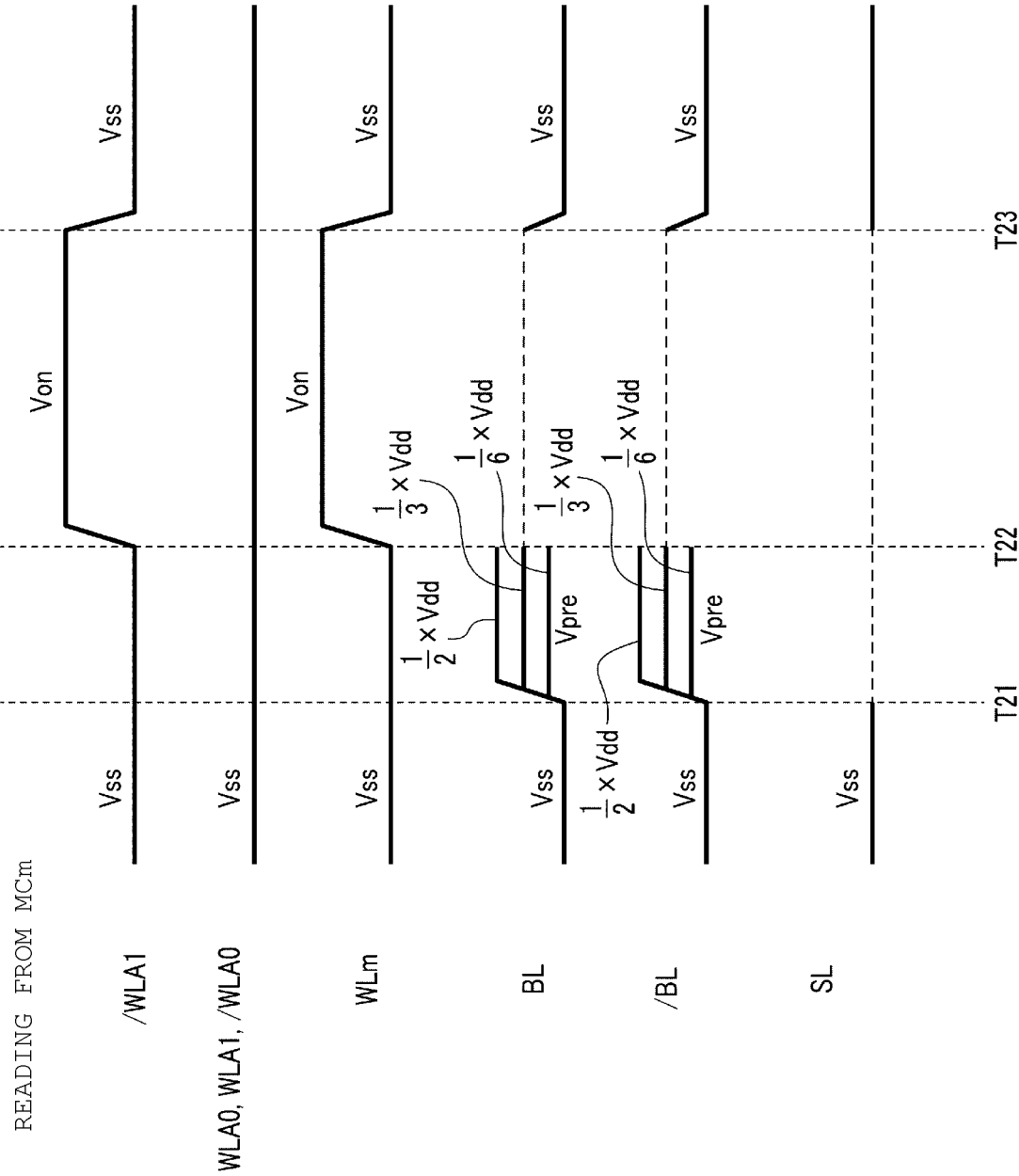
FIG. 14 is a timing chart of various voltages during a read operation of the memory cell in the semiconductor memory device according to the first embodiment.
Figure 15:
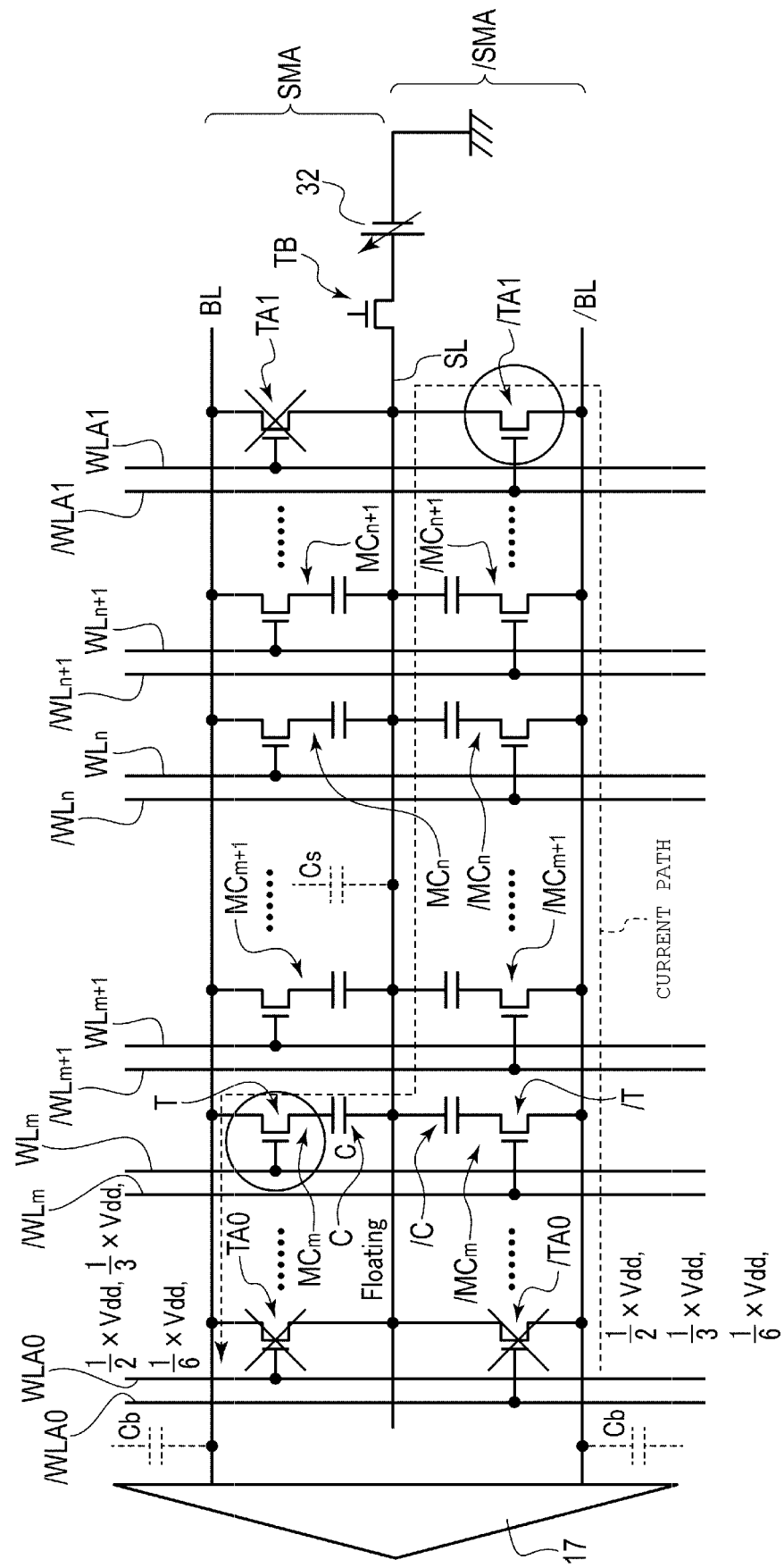
FIG. 15 is a diagram illustrating the read operation of the memory cell in the semiconductor memory device according to the first embodiment.

FIG. 14 is a timing chart of various voltages during the read operation of the memory cell MCm in the semiconductor memory device according to the first embodiment. FIG. 15 is a diagram illustrating the read operation of the memory cell MCm in the semiconductor memory device according to the first embodiment and corresponds to times T22 to T23 in FIG. 14.

As illustrated in FIG. 14, in the read operation of the memory cell MCm, the voltage Vss is applied to each control line as initial setting.

Next, at time T21, the read voltage Vpre (voltage (⅙)×Vdd, (⅓)×Vdd, (½)×Vdd) is applied to the bit line BL. At the time T21, the read voltage Vpre which is the same as the voltage of the bit line BL is applied to the bit line /BL. In addition, at the time T21, the source line SL is in a floating state.

FIG. 14 illustrates that the read voltage Vpre applied to one of the bit lines BL and /BL. However, as will be described below in the second embodiment, the read voltages may be applied in a time divisional (sequential) manner. In a case where multivalue data is read at once, the above-mentioned open voltage is applied to the bit lines BL and /BL at the time T21.

Next, at the time T22, the voltage Von is applied to the word line WLm. Meanwhile, the other word lines WL and the word lines /WL maintain the voltage Vss. In addition, at the time T22, the voltage Von is applied to the word line /WLA1. Meanwhile, the word lines WLA0, WLA1, and /WLA0 maintain the voltage Vss.

Thereby, as illustrated in FIG. 15, the select transistor T of the memory cell MCm is turned on, and the select transistors T of the other memory cells MC and the select transistors /T of the memory cells /MC are turned off. Furthermore, the transistor /TA1 is turned on, and the transistors TA0, TA1, and /TA0 are turned off.

As a result, a current path is formed from a first input terminal (connection terminal to the bit line /BL) to a second input terminal (connection terminal to the bit line BL) of the sense amplifier 17. The current path passes through the bit line /BL, the transistor /TA1, the source line SL, the memory cell MCm, and the bit line BL. Thereby, electric charges of the capacitor C in the memory cell MCm move to the bit line BL and/or the bit line /BL, and the voltages of the bit lines BL and /BL change. At this time, a voltage difference ΔV1 between the bit line BL and the bit line /BL is represented by the following equation (1).

$$\Delta V1 = \{(2C+Cs)/(2C+Cs+Cb) + 2C/(2C+Cb)\} \times \tfrac{1}{2} \times V\text{storage} \quad (1)$$

Here, C indicates a capacitance of each of the capacitors C in the memory cells MC and /MC, Cs indicates a parasitic capacitance of the source line SL, and Cb indicates a parasitic capacitance of each of the bit lines BL and /BL. As described above, Vstorage is any one of the write voltages Vstorage00, Vstorage01, Vstorage10, and Vstorage11 corresponding to data stored in the memory cell MCm.

The sense amplifier 17 senses the voltage difference ΔV1 and detects data stored in the memory cell MCm.

Thereafter, as illustrated in FIG. 14, the voltage Vss is applied to each control line at the time T23. By doing so, reading the memory cell MCm is completed.

Figure 16:
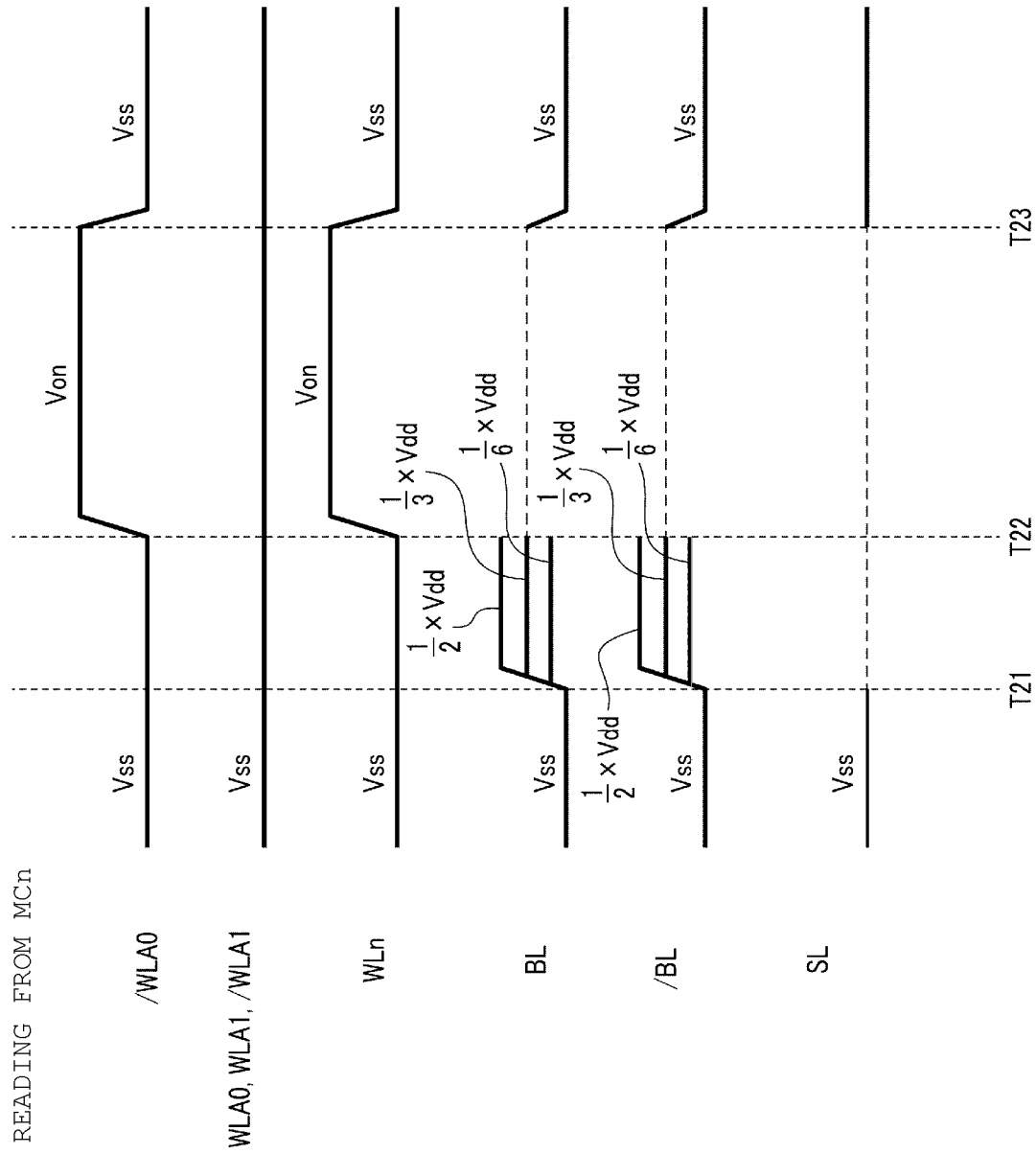
FIG. 16 is a timing chart of various voltages during the read operation of the memory cell in the semiconductor memory device according to the first embodiment.

FIG. 16 is a timing chart of various voltages during the read operation of the memory cell MCn in the semiconductor memory device according to the first embodiment.

As illustrated in FIG. 16, in the write operation of the memory cell MCn, the voltage Von is applied to the word line WLn at the time T22, unlike the read operation of the memory cell MCm in FIG. 14. Meanwhile, the other word lines WL and the word lines /WL maintain the voltage Vss. In addition, at the time T22, the voltage Von is applied to the word line /WLA0. Meanwhile, the word lines WLA0, WLA1, and /WLA1 maintain the voltage Vss.

Thereby, the select transistor T of the memory cell MCn is turned on, and the select transistors T of the other memory cells MC and the select transistors /T of the memory cells /MC are turned off. In addition, the transistor /TA0 is turned on, and the transistors TA0, TA1, and /TA1 are turned off.

As a result, the current path passes through the bit line /BL, the transistor /TA0, the source line SL, the memory cell MCn, and the bit line BL. Thereby, the electric charges of the capacitor C of the memory cell MCn move to the bit line BL and/or the bit line /BL, and the voltages of the bit lines BL and /BL change. The sense amplifier 17 senses the voltage difference $\Delta V1$ between the bit line BL and the bit line /BL at this time and detects data stored in the memory cell MCn.

Figure 17:
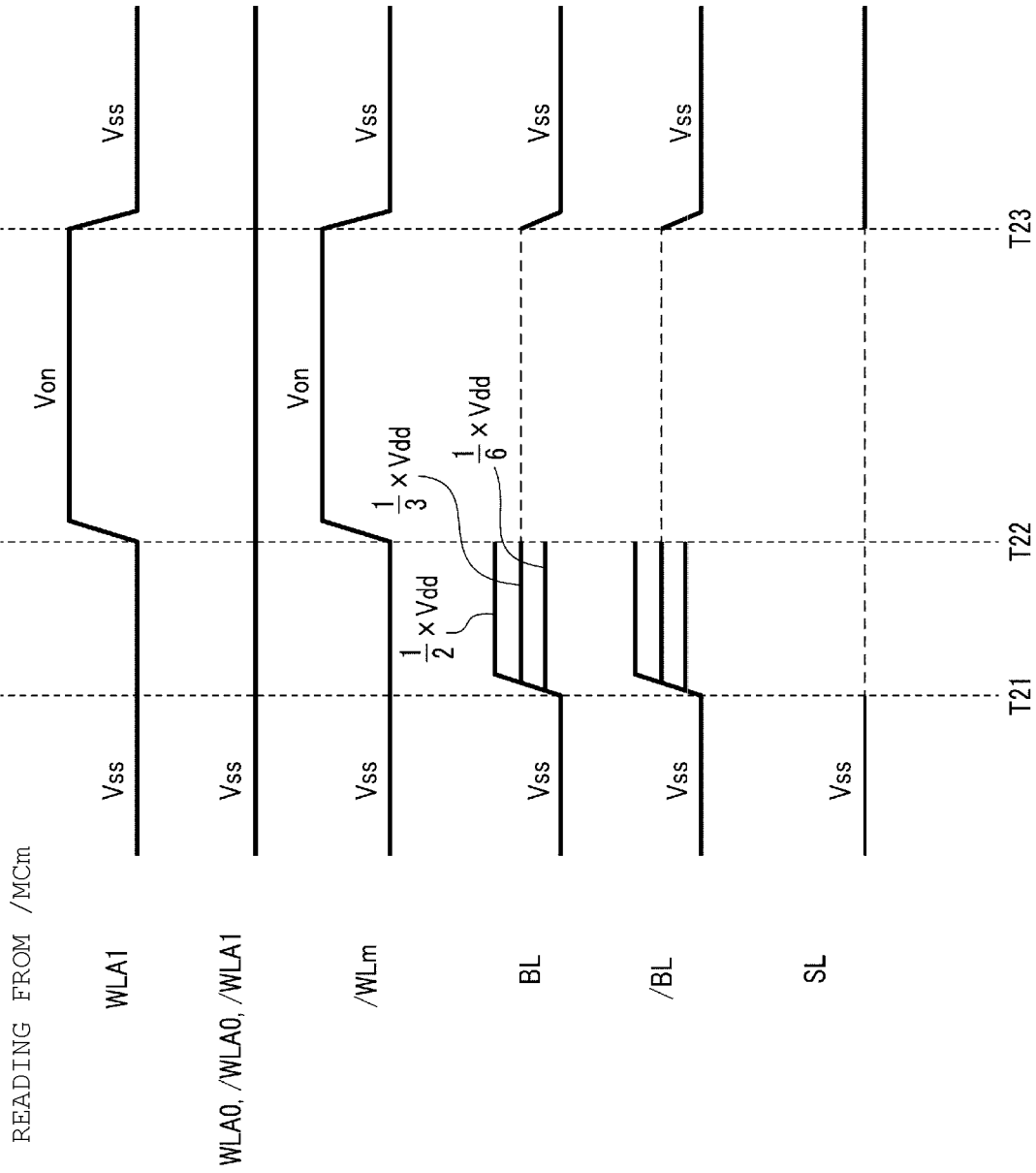
FIG. 17 is a timing chart of various voltages during the read operation of the memory cell in the semiconductor memory device according to the first embodiment.

FIG. 17 is a timing chart of various voltages during the read operation of the memory cell /MCm in the semiconductor memory device according to the first embodiment.

As illustrated in FIG. 17, in the write operation of the memory cell /MCm, the voltage Von is applied to the word line /WLm at the time T22 unlike the read operation of the memory cell MCm of FIG. 14. Meanwhile, the other word lines /WL and the word lines WL maintain the voltage Vss. In addition, at the time T22, the voltage Von is applied to the word line WLA1. Meanwhile, the word lines WLA0, /WLA0, and /WLA1 maintain the voltage Vss.

Thereby, the select transistor /T of the memory cell /MCm is turned on, and the select transistors /T of the other memory cells /MC and the select transistors T of the memory cells MC are turned off. In addition, the transistor TA1 is turned on, and the transistors TA0, /TA0, and /TA1 are turned off.

As a result, the current path passes through the bit line BL, the transistor TA1, the source line SL, the memory cell /MCm, and the bit line /BL. Thereby, electric charges of the capacitor /C of the memory cell /MCm move to the bit line BL and/or the bit line /BL, and the voltages of the bit lines BL and /BL change. The sense amplifier 17 senses the voltage difference $\Delta V1$ between the bit line BL and the bit line /BL at this time, and detects data stored in the memory cell /MCm.

Figure 18:
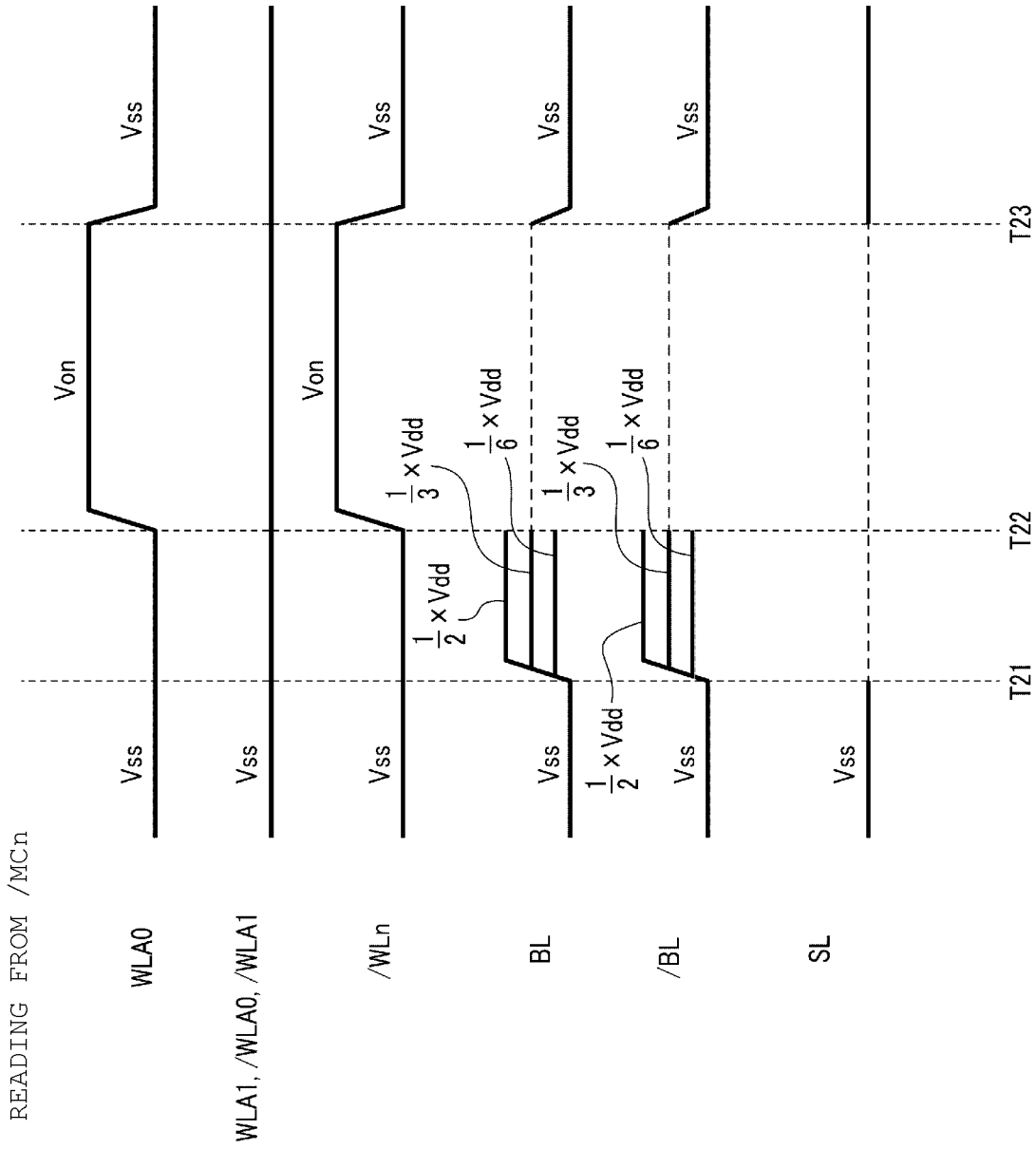
FIG. 18 is a timing chart of various voltages during the read operation of the memory cell in the semiconductor memory device according to the first embodiment.

FIG. 18 is a timing chart of various voltages during the read operation of the memory cell /MCn in the semiconductor memory device according to the first embodiment.

As illustrated in FIG. 18, in the write operation of the memory cell /MCn, the voltage Von is applied to the word line /WLn at the time T22, unlike the read operation of memory cell MCm in FIG. 14. Meanwhile, the other word lines /WL and the word lines WL maintain the voltage Vss. In addition, at the time T22, the voltage Von is applied to the word line WLA0. Meanwhile, the word lines WLA1, /WLA0, and /WLA1 maintain the voltage Vss.

Thereby, the select transistor /T of the memory cell /MCn is turned on, and the select transistors /T of the other memory cells /MC and the select transistors T of the memory cells MC are turned off. In addition, the transistor TA0 is turned on, and the transistors TA1, /TA0, and /TA1 are turned off.

As a result, the current path passes through the bit line BL, the transistor TA0, the source line SL, the memory cell /MCn, and the bit line /BL. Thereby, the electric charges of the capacitor /C of the memory cell /MCn move to the bit line BL and/or the bit line /BL, and the voltages of the bit lines BL and /BL change. The sense amplifier 17 senses the voltage difference $\Delta V1$ between the bit line BL and the bit line /BL at this time and detects data stored in the memory cell /MCn.

Effect of First Embodiment

Figure 19:
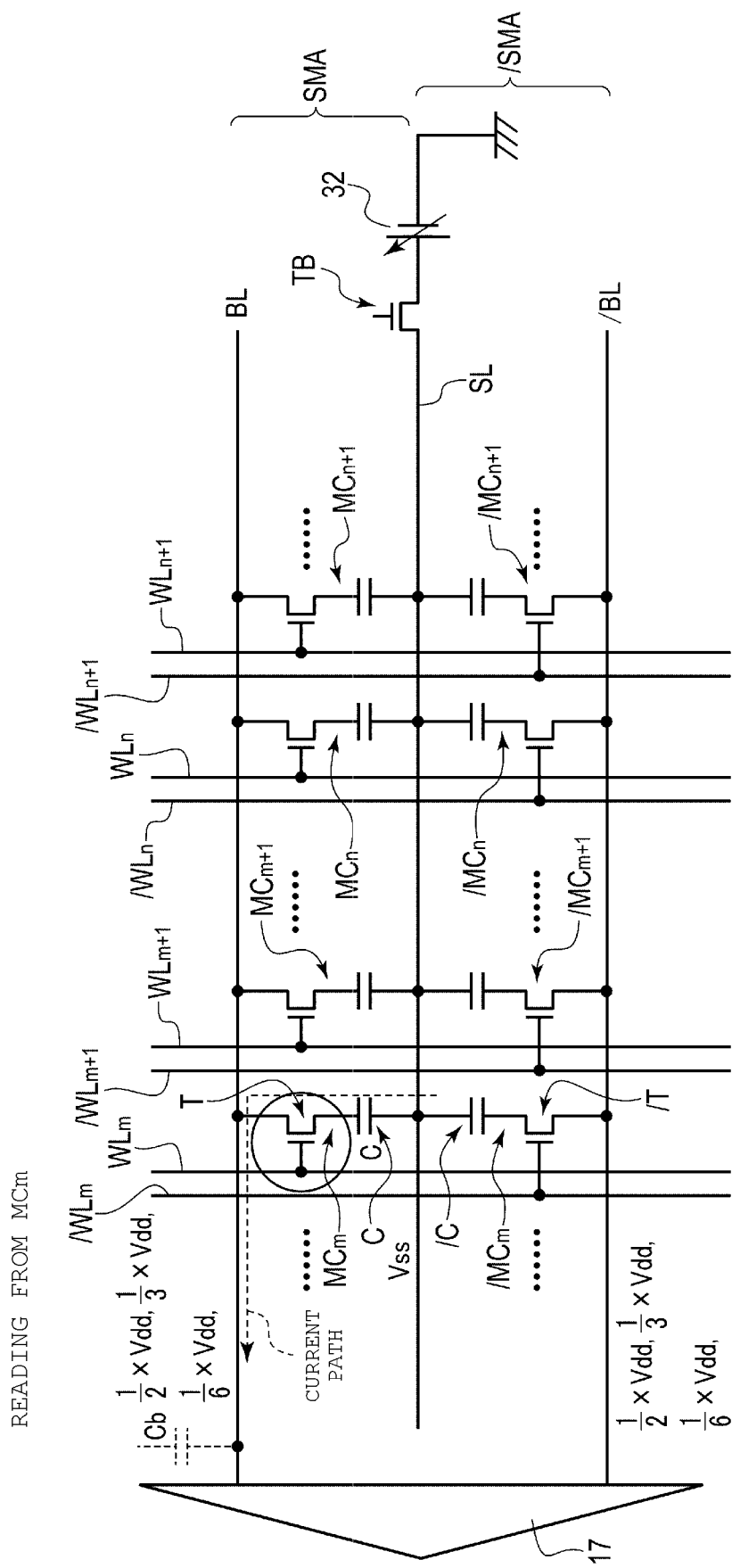
FIG. 19 is a diagram illustrating a read operation of a memory cell in a semiconductor memory device according to a comparative example.

FIG. 19 is a diagram illustrating the read operation of the memory cell MCm in the semiconductor memory device according to a comparative example.

As illustrated in FIG. 19, in the comparative example, the memory cell array 18 includes the sub memory cell arrays SMA and /SMA. However, the sub memory cell array SMA does not include the transistors TA0 and TA1, and the sub memory cell array /SMA does not include the transistors /TA0 and /TA1, unlike the first embodiment.

In the read operation according to the comparative example, the read voltage Vpre (($1/6$)×Vdd, ($1/3$)×Vdd, and ($1/2$)×Vdd) is applied to the bit line BL. In addition, the read voltage Vpre is applied to the bit line /BL in the same manner as the bit line BL. In addition, the voltage Vss is applied to the source line SL. Furthermore, the voltage Von is applied to the word line WLm.

Thereby, the select transistor T of the memory cell MCm is turned on, and a current path is formed from the second input terminal (connection terminal to the bit line BL) of the sense amplifier 17 to the source line SL. Thereby, the electric charges of the capacitor C of the memory cell MCm move to the bit line BL, and the voltage of the bit line BL changes. Meanwhile, the voltage of the bit line /BL does not change. At this time, a voltage difference $\Delta V2$ between the bit line BL and the bit line /BL is represented by the following equation (2).

$$\Delta \Delta V2 = (1/2) \times V\text{storage} \times \{C/(C+Cb)\} \quad (2)$$

Here, in the same manner as the equation (1), C indicates the capacitances of the capacitors C in the memory cells MC and /MC, Cb indicates parasitic capacitances of the bit lines BL and /BL, and Vstorage indicates anyone of the write voltages Vstorage00, Vstorage01, Vstorage10, and Vstorage11 corresponding to the data to be stored in the memory cell MCm.

In the above-described comparative example, in a case where data (for example, data 01 and 10) corresponding to the small write voltage Vstorage is read, $\Delta V2$ decreases. Accordingly, the sense amplifier 17 cannot sense the read signal and a read error occurs.

In contrast to this, in the first embodiment described above, the transistor TA is provided between the bit line BL and the source line SL, and the transistor /TA is provided between the bit line /BL and the source line SL. In the read operation of the memory cell MC, the transistor /TA is turned on together with the select transistor T of the memory cell MC. In addition, in reading the memory cell /MC, the transistor TA is turned on together with the select transistor /T of the memory cell /MC. As a result of the transistors TA and /TA being selected and turned on, the source line SL is lengthened (so as to increase its parasitic capacitance) in the current path at the time of reading. Accordingly, the voltage difference $\Delta V1$ between the bit line BL and the bit line /BL becomes the voltage difference represented by the above-described equation (1) and may be increased more than the voltage difference $\Delta V2$ represented by the equation (2) in the comparative example.

This is because a memory cell configured with one transistor and one capacitor is read in the comparative embodiment, whereas a memory cell configured with two pseudo transistors and one capacitor is read in the first embodiment. An additional reason is that the current path is formed so as to increase the parasitic capacitance of the source line SL at the time of reading in the first embodiment.

Figure 20:
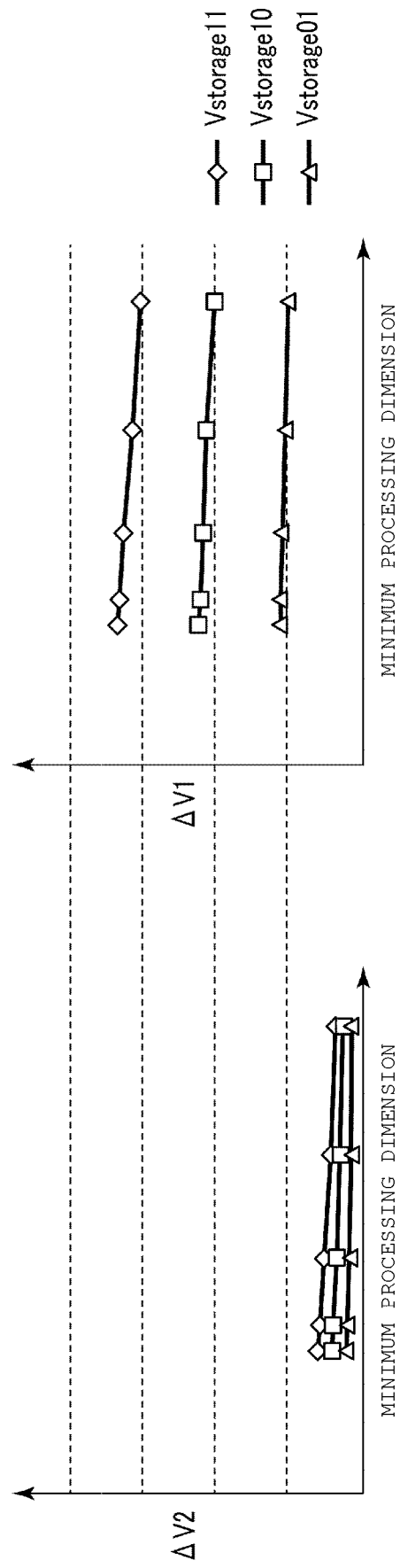
FIGS. 20A and 20B are diagrams illustrating voltages sensed in the read operations of the semiconductor memory devices according to the first embodiment and the comparative example.

FIG. 20 is a diagram illustrating voltages $\Delta V$ sensed during the read operation of the semiconductor memory device according to the first embodiment and the comparative example. FIG. 20A illustrates results of equation (2)

according to the comparative example, and FIG. 20B illustrates result of equation (1) according to the first embodiment.

Here, a horizontal axis denotes a minimum processing dimension, that is, a line pitch or the like. In addition, here, each case of the write voltages'Vstorage01 (($\frac{1}{3}$)×Vdd), Vstorage10 (($\frac{2}{3}$)×Vdd), and Vstorage11 (Vdd) corresponding to the data stored in the memory cells MC and /MC is illustrated.

As illustrated in FIG. 20, $\Delta$V1 in the first embodiment is approximately four times $\Delta$V2 in the comparative example even in any of the write voltages Vstorage01, Vstorage10, and Vstorage11 regardless of the minimum processing dimension. That is, it is possible to amplify a read signal and to prevent a read error from occurring in the first embodiment in comparison with the comparative example.

Second Embodiment

A semiconductor memory device according to a second embodiment will be described hereinafter with reference to FIGS. 21 to 22. In the second embodiment, the memory cell configured with two pseudo transistors and one capacitor are read in a time-divisional multivalue read operation of the memory cells MC and /MC.

In the second embodiment, descriptions on the same points as in the first embodiment are omitted, and different points will be mainly described.

Configuration Example of Second Embodiment

Figure 21:
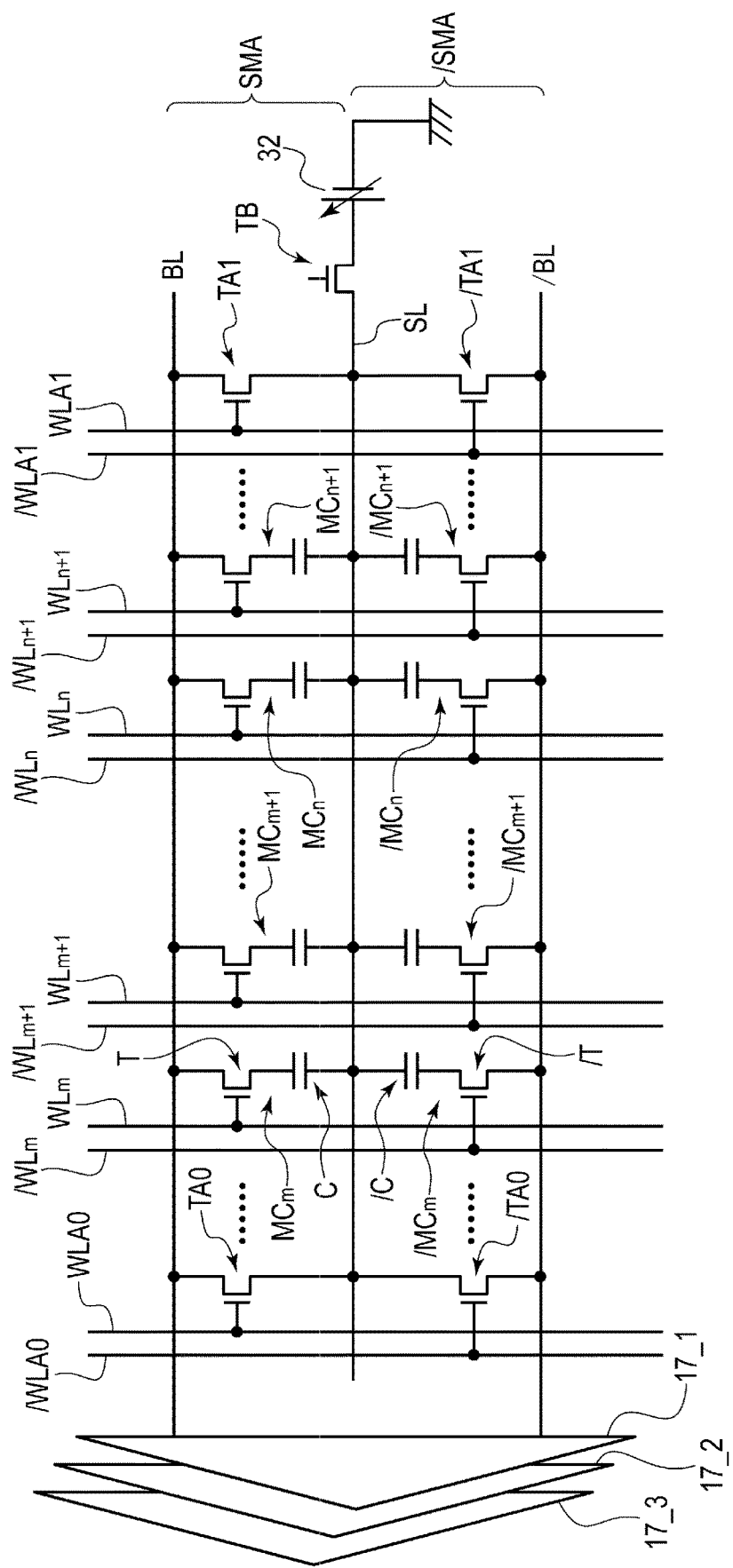
FIG. 21 is a circuit diagram illustrating a memory cell array of a semiconductor memory device according to a second embodiment.

FIG. 21 is a circuit diagram illustrating the memory cell array 18 of the semiconductor memory device according to the second embodiment, and is a circuit diagram corresponding to the memory cell array 18 illustrated in FIG. 2.

As illustrated in FIG. 21, a plurality of sense amplifiers 17_1 to 17_3 are provided in the second embodiment. Each of the plurality of sense amplifiers 17_1 to 17_3 is electrically connected to the bit line BL and the bit line /BL via a transistor (not illustrated). Each of the plurality of sense amplifiers 17_1 to 17_3 senses a voltage difference between the bit line BL and the bit line /BL at the time of reading and detects data corresponding to the voltage difference.

More specifically, the sense amplifier 17_1 senses a voltage change depending on the data 01 in a case where the read voltage Vpre01 is applied to the bit lines BL and /BL, and detects the data 01. Meanwhile, the sense amplifier 17_1 does not detect data if a voltage change depending on data other than the data 01 is sensed.

In addition, the sense amplifier 17_2 senses a voltage change depending on data 10 in a case where the read voltage Vpre10 is applied to the bit lines BL and /BL, and detects the data 10. Meanwhile, the sense amplifier 17_2 does not detect data if a voltage change depending on data other than the data 10 is sensed.

In addition, the sense amplifier 17_3 senses a voltage change depending on data 11 in a case where the read voltage Vpre11 is applied to the bit lines BL and /BL, and detects the data 11. Meanwhile, the sense amplifier 17_3 does not detect data if a voltage change depending on data other than the data 11 is sensed.

Example of Operation of Second Embodiment

FIG. 22 is a timing chart of various voltages during the read operation of the memory cell MCm in the semiconductor memory device according to the second embodiment.

In the present example, a plurality of read voltages Vpre are time-divisionally applied to the bit lines BL and /BL. Even in a case where the applied voltage Vpre is low (in a case where data corresponding to the small write voltage Vstorage is read), a memory cell configured with two pseudo transistors and one capacitor can be read. Details will be described hereinafter.

As illustrated in FIG. 22, the voltage Vss is applied to each control line as initial setting during the read operation of the memory cell MCm.

Next, at time T31, the read voltage Vpre01 (($\frac{1}{6}$)×Vdd) is applied to the bit line BL. In addition, at time T31, the read voltage Vpre01 which is the same as the voltage of the bit line BL is applied to the bit line /BL. In addition, at time T31, the source line SL is in a floating state. At this time, while not illustrated, a transistor between the sense amplifier 17_1 and the bit lines BL and /BL is turned on, and the sense amplifier 17_1 is electrically connected to the bit lines BL and /BL.

Next, at time T32, the voltage Von is applied to the word line WLm. Meanwhile, the other word lines WL and the word line /WL maintain the voltage Vss. In addition, at time T32, the voltage Von is applied to word line /WLA1. Meanwhile, the word lines WLA0, WLA1, and /WLA0 maintain the voltage Vss.

Thereby, the select transistor T of the memory cell MCm is turned on, and the select transistors T of the other memory cells MC and the select transistors /T of the memory cells /MC are turned off. In addition, the transistor /TA1 is turned on, and the transistors TA0, TA1, and /TA0 are turned off.

As a result, a current path passes through the bit line /BL, the transistor /TA1, the source line SL, the memory cell MCm, and the bit line BL. Thereby, electric charges of the capacitor C of the memory cell MCm move to the bit line BL and/or the bit line /BL, and voltages of the bit lines BL and /BL change. The sense amplifier 17_1 senses the voltage difference $\Delta$V1 between the bit line BL and the bit line /BL at this time. Then, the sense amplifier 17_1 detects data in a case where the memory cell MCm stores the data 01. Meanwhile, the sense amplifier 17_1 does not detect data in a case where the memory cell MCm stores data other than the data 01.

Next, at time T33, the voltage Vss is applied to each control line.

In a case where no data is detected by the above operation, the read voltage Vpre10 (($\frac{1}{3}$)×Vdd) is subsequently applied to the bit line BL at time T34. At the time T34, the read voltage Vpre10 which is the same as the voltage of the bit line BL is applied to the bit line /BL. In addition, at the time T34, the source line SL is in a floating state. At this time, while not illustrated, a transistor between the sense amplifier 17_2 and the bit lines BL and /BL is turned on, and the sense amplifier 17_2 is electrically connected to the bit lines BL and /BL.

Next, at time T35, the voltage Von is applied to the word line WLm. Meanwhile, the other word lines WL and the word line /WL maintain the voltage Vss. In addition, at the time T35, the voltage Von is applied to the word line /WL-A1. Meanwhile, the word lines WLA0, WLA1, and /WLA0 maintain the voltage Vss .

Thereby, the select transistor T of the memory cell MCm is turned on, and the select transistors T of the other memory cells MC and the select transistors /T of the memory cells /MC are turned off. In addition, the transistor /TA1 is turned on, and the transistors TA0, TA1, and /TA0 are turned off.

As a result, the current path passes through the bit line /BL, the transistor /TA1, the source line SL, the memory cell MCm, and the bit line BL. Thereby, the electric charges of the capacitor C of the memory cell MCm move to the bit line BL and/or the bit line /BL, and the voltages of the bit lines BL and /BL change. The sense amplifier 17_2 senses the voltage difference ΔV1 between the bit line BL and the bit line /BL at this time. Then, the sense amplifier 17_2 detects data in a case where the memory cell MCm stores the data 10. Meanwhile, the sense amplifier 17_2 does not detect the data in a case where the memory cell MCm stores data other than the data 10.

Next, at time T36, the voltage Vss is applied to each control line.

In a case where no data is detected by the above operation, the read voltage Vpre11 ((½)×Vdd) is subsequently applied to the bit line BL at time T37. At the time T37, the read voltage Vpre11 which is the same as the voltage of the bit line BL is applied to the bit line /BL. In addition, at the time T37, the source line SL maintains the voltage Vss. At this time, while not illustrated, a transistor between the sense amplifier 17_3 and the bit lines BL and /BL is turned on, and the sense amplifier 17_3 is electrically connected to the bit lines BL and /BL.

Next, at time T38, the voltage Von is applied to the word line WLm. Meanwhile, the other word lines WL and the word lines /WL maintain the voltage Vss. In addition, at the time T38, the word line /WLA1 maintains the voltage Vss. In the same manner, the word lines WLA0, WLA1, and /WLA0 maintain the voltage Vss.

Thereby, the select transistor T of the memory cell MCm is turned on, and the select transistors T of the other memory cells MC and the select transistors /T of the memory cells /MC are turned off. In addition, the transistors TA0, TA1, /TA0, and /TA1 are turned off.

As a result, the current path passes through the memory cell MCm and the bit line BL. Thereby, the electric charges of the capacitor C of the memory cell MCm move to the bit line BL, and the voltage of the bit line BL changes. Meanwhile, the voltage of the bit line /BL does not change. The sense amplifier 17_3 senses the voltage difference ΔV1 between the bit line BL and the bit line /BL at this time. Then, the sense amplifier 17_3 detects data in a case where the memory cell MCm stores the data 11. Meanwhile, the sense amplifier 17_3 does not detect the data in a case where the memory cell MCm stores data other than the data 11.

Thereafter, at time T39, the voltage Vss is applied to each control line. By doing so, reading the memory cell MCm is completed.

Effect of Second Embodiment

According to the second embodiment, the plurality of read voltages Vpre are time-divisionally applied to the bit lines BL and /BL. In this case, when the applied read voltage Vpre is low (for example, in a case where the read voltages Vpre01 and Vpre 10 are applied), the transistors TA and /TA are turned on. That is, in a case where the read voltage Vpre is low, the memory cell configured with two pseudo transistors and one capacitor is read. Meanwhile, in a case where the applied read voltage Vpre is high (for example, in a case where the read voltage Vpre11 is applied), the transistors TA and /TA are turned off, and the memory cell configured with one transistor and one capacitor is read. In this manner, in the second embodiment, for example, in a case where a read signal is large (in a case where the read voltage Vpre is high), it is not necessary to turn on the transistors TA and /TA, and to control the operation according to situation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell that includes a first transistor and a first capacitor;
   a second transistor having a first terminal that is connected to a first terminal of the first memory cell;
   a first bit line that is connected to a second terminal of the first memory cell;
   a second bit line that is connected to a second terminal of the second transistor;
   a controller configured to turn on the first transistor and turn off the second transistor during a write operation on the first memory cell, and to turn on the first transistor and the second transistor during a read operation on the first memory cell;
   a second memory cell that includes a third transistor, a second capacitor, a first terminal which is connected to the first terminal of the first memory cell, and a second terminal which is connected to the second bit line; and
   a fourth transistor that includes a first terminal which is connected to the first terminal of the second memory cell and a second terminal which is connected to the first bit line,
   wherein the controller is configured to turn on the third transistor and turn off the fourth transistor during a write operation on the second memory cell, and to turn on the third transistor and the fourth transistor during a read operation on the second memory cell.

2. The semiconductor memory device according to claim 1, further comprising:
   a source line that is connected to the first terminal of the first memory cell and the first terminal of the second memory cell.

3. The semiconductor memory device according to claim 2, further comprising:
   a power supply that supplies a certain voltage to the source line.

4. The semiconductor memory device according to claim 1, further comprising:
   a third memory cell that is configured with a fifth transistor, a third capacitor, a first terminal which is connected to the first terminal of the first memory cell, and a second terminal which is connected to the second bit line.

5. The semiconductor memory device according to claim 4, further comprising:
   a sixth transistor that includes a first terminal which is connected to the first terminal of the third memory cell and a second terminal which is connected to the first bit line,
   wherein a distance from the second memory cell to the fourth transistor is longer than a distance from the second memory cell to the sixth transistor, wherein a distance from the third memory cell to the fourth transistor is shorter than a distance from the third memory cell to the sixth transistor, and wherein the controller is configured to turn on the fifth transistor and turn off the sixth transistor during a write operation on the third memory cell and to turn on the fifth transistor and the sixth transistor during a read operation on the third memory cell.

6. A semiconductor memory device comprising:

a first memory cell that includes a first transistor and a first capacitor;

a second transistor having a first terminal that is connected to a first terminal of the first memory cell;

a first bit line that is connected to a second terminal of the first memory cell;

a second bit line that is connected to a second terminal of the second transistor;

a controller configured to turn on the first transistor and turn off the second transistor during a write operation on the first memory cell, and to turn on the first transistor and the second transistor during a read operation on the first memory cell;

a second memory cell that includes a third transistor, a second capacitor, a first terminal which is connected to the first terminal of the first memory cell, and a second terminal which is connected to the first bit line; and a fourth transistor that includes a first terminal which is connected to the first terminal of the second memory cell and a second terminal which is connected to the second bit line, wherein a distance from the first memory cell to the second transistor is longer than a distance from the first memory cell to the fourth transistor, wherein a distance from the second memory cell to the second transistor is shorter than a distance from the second memory cell to the fourth transistor, and wherein the controller is configured to turn on the third transistor and turn off the fourth transistor during a write operation on the second memory cell, and to turn on the third transistor and the fourth transistor during a read operation on the second memory cell.

7. A semiconductor memory device comprising:

a first memory cell that includes a first transistor and a first capacitor;

a second memory cell that includes a second transistor and a second capacitor;

a third transistor;

a first bit line that is connected to a first terminal of the first memory cell;

a second bit line that is connected to a first terminal of the second memory cell and a first terminal of the third transistor;

a source line that is connected to a second terminal of the first memory cell, a second terminal of the second memory cell, and a second terminal of the third transistor; and a plurality of sense amplifiers configured to read data stored in the first or second memory cell in a time-division manner.

8. The semiconductor memory device according to claim 7, further comprising:

a fourth transistor that includes a first terminal which is connected to the source line and a second terminal which is connected to the first bit line.

9. The semiconductor memory device according to claim 8, further comprising:

a power supply that supplies a certain voltage to the source line.

10. The semiconductor memory device according to claim 7, further comprising:

a sense amplifier configured to read a multivalue data stored in the first or second memory cell at once.

11. A method of controlling a semiconductor memory device including a first memory cell that includes a first transistor and a first capacitor, a second transistor having a first terminal that is connected to a first terminal of the first memory cell, a first bit line that is connected to a second terminal of the first memory cell, a second bit line that is connected to a second terminal of the second transistor, a second memory cell that includes a third transistor, a second capacitor, a first terminal which is connected to the first terminal of the first memory cell, and a second terminal which is connected to the second bit line, a fourth transistor that includes a first terminal which is connected to the first terminal of the second memory cell and a second terminal which is connected to the first bit line, said method comprising:

turning on the first transistor and turning off the second transistor during a write operation on the first memory cell;

turning on the first transistor and the second transistor during a read operation on the first memory cell;

turning on the third transistor and turning off the fourth transistor during a write operation on the second memory cell; and turning on the third transistor and the fourth transistor during a read operation on the second memory cell.

12. The method according to claim 11, further comprising:

supplying a power supply voltage to a source line that is connected to the first terminal of the first memory cell and the first terminal of the second memory cell.

13. The method according to claim 11, wherein the semiconductor memory device further includes:

a third memory cell that is configured with a fifth transistor, a third capacitor, a first terminal which is connected to the first terminal of the first memory cell, and a second terminal which is connected to the second bit line; and a sixth transistor that includes a first terminal which is connected to the first terminal of the third memory cell and a second terminal which is connected to the first bit line.

14. The method according to claim 13, wherein a distance from the second memory cell to the fourth transistor is longer than a distance from the second memory cell to the sixth transistor, and a distance from the third memory cell to the fourth transistor is shorter than a distance from the third memory cell to the sixth transistor.

* * * * *